United States Patent
Aziz et al.

(10) Patent No.: US 6,614,175 B2
(45) Date of Patent: Sep. 2, 2003

(54) ORGANIC LIGHT EMITTING DEVICES

(75) Inventors: Hany Aziz, Burlington (CA); Zoran D. Popovic, Mississauga (CA); Nan-Xing Hu, Oakville (CA)

(73) Assignee: Xerox Corporation, Stamford, CT (US)

(*) Notice: Subject to any disclaimer, the term of this patent is extended or adjusted under 35 U.S.C. 154(b) by 364 days.

(21) Appl. No.: 09/770,159

(22) Filed: Jan. 26, 2001

(65) Prior Publication Data

US 2002/0135296 A1 Sep. 26, 2002

(51) Int. Cl.⁷ .............................. H01J 1/62; H01J 63/04
(52) U.S. Cl. ........................................................ 313/504
(58) Field of Search ................................. 313/504, 505, 313/506, 507, 508, 509; 428/690, 691, 917; 252/301.4 T, 301.16, 301.22, 301.23; 548/103, 136, 143

(56) References Cited

U.S. PATENT DOCUMENTS

| | | | |
|---|---|---|---|
| 3,172,862 A | 3/1965 | Gurnee et al. ............ 252/301.3 |
| 3,530,325 A | 9/1970 | Mehl et al. ................... 313/108 |
| 4,356,429 A | 10/1982 | Tang ........................... 313/503 |
| 4,539,507 A | 9/1985 | VanSlyke et al. ............ 313/504 |
| 4,720,432 A | 1/1988 | VanSlyke et al. ............ 428/457 |
| 4,885,211 A | 12/1989 | Tang et al. .................. 428/457 |
| 5,141,671 A | 8/1992 | Bryan et al. ............ 252/301.16 |
| 5,150,006 A | 9/1992 | VanSlyke et al. ............ 313/504 |
| 5,151,629 A | 9/1992 | VanSlyke ..................... 313/504 |
| 5,227,252 A | 7/1993 | Murayama et al. ......... 428/690 |
| 5,276,381 A | 1/1994 | Wakimoto et al. .......... 313/504 |
| 5,429,884 A | 7/1995 | Namiki et al. .............. 428/690 |
| 5,457,565 A | 10/1995 | Namiki et al. .............. 359/273 |
| 5,516,577 A | 5/1996 | Matsuura et al. ............ 428/212 |
| 5,593,788 A | 1/1997 | Shi et al. ..................... 428/690 |
| 5,601,903 A | 2/1997 | Fujii et al. ................... 428/212 |
| 5,703,436 A | 12/1997 | Forrest et al. ............... 313/506 |
| 5,707,745 A | 1/1998 | Forrest et al. ............... 428/432 |
| 5,739,635 A | 4/1998 | Wakimoto .................... 313/504 |
| 5,776,662 A | 7/1998 | Shirai et al. ................. 430/313 |
| 5,932,363 A | 8/1999 | Hu et al. ...................... 428/690 |
| 5,935,720 A | 8/1999 | Chen et al. .................. 428/690 |
| 6,057,048 A | 5/2000 | Hu et al. ...................... 428/690 |

Primary Examiner—William Oen
(74) Attorney, Agent, or Firm—Eugene O. Palazzo

(57) ABSTRACT

An organic light emitting device which contains a mixed region of a hole transport, an electron transport, and an organic luminescent component. The mixed region can be situated between two electrodes, one of which includes a thermal protective layer. Further, the device contains a hole transport region situated between the mixed region and an anode electrode, and an electron transport layer situated between the mixed region and a cathode electrode.

36 Claims, 2 Drawing Sheets

ORGANIC LIGHT EMITTING DEVICES

RELATED PATENTS

Illustrated in U.S. Pat. No. 6,479,172, the disclosure of which is totally incorporated herein by reference, is an electroluminescent device comprised of a first electrode, an organic electroluminescent element, and a second electrode wherein said electroluminescent element contains a fluorescent hydrocarbon component of Formula (I)

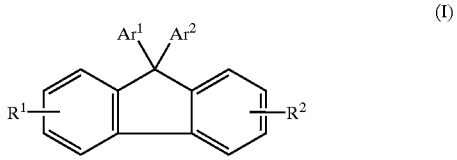

(I)

wherein $R^1$ and $R^2$ are substituents selected from the group consisting of hydrogen, an alkyl, an alicyclic alkyl, an alkoxy, a halogen, and a cyano; $Ar^1$ and $Ar^2$ are each independently an aromatic component or an aryl group comprised of a from about 4 to about 15 conjugate-bonded or fused benzene rings; and in application U.S. Ser. No. 10/770,154, Publication No. 20020145380, filed concurrently herewith, the disclosure of which is totally incorporated herein by reference, is an organic light emitting device comprising in sequence a substrate;

a first electrode;

a light-emitting region comprising an organic luminescent material; and a second electrode, and a thermal protective element over the second electrode.

Illustrated in U.S. Pat. No. 6,392,339 on "Organic Light Emitting Devices Having Improved Efficiency and Operation Lifetime", filed on Jul. 20, 1999 and U.S. Pat. No. 6,392,250 on "Organic Light Emitting Devices Having Improved Performance", filed on Jun. 30, 2000, the disclosures of which are totally incorporated herein by reference, are organic light emitting devices (organic EL devices) that, for example, comprise a mixed region including a mixture of a hole transport material and an electron transport material. At least one of a hole transport material region and an electron transport material region can be formed on the mixed region. The stability of the above mentioned organic EL devices disclosed in U.S. Pat. No. 6,392,339 and U.S. Pat. No. 6,392,250 is usually reduced at temperatures above 80° C., due it is believed to a decrease in the device resistance to shorting and also since it is believed to a progressive increase in the driving voltage required to drive a certain current through the organic EL devices. As a result, the operational stability of these devices can be limited to few hundred hours or less at these high temperatures, and more specifically, at high temperatures in the range of from about 80° C. to about 100° C. Therefore, these devices are believed to be unsatisfactory in some instances, for applications in which there is desired an operational stability of the organic EL device of at least, for example, several thousand hours at temperatures of, for example, 90° C., such as, for example, in some automotive, military or other industrial applications where durability in harsh conditions is desired and/or necessary.

The appropriate components and processes of the above copending applications may be selected for embodiments of the present invention in embodiments thereof.

1. Background of the Invention

This invention relates to optoelectronic devices and, more particularly, to organic light emitting devices (organic EL devices). More specifically, the present invention relates to substantially stable organic EL devices and which devices do not in embodiments, for example, usually degrade at high temperatures, such as about 100° C., and moreover, which devices are not substantially adversely affected by high temperatures. This invention also relates in embodiments to methods for the preparation of organic light emitting devices and uses thereof.

2. Prior Art

An organic EL device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of prior art organic EL devices have been prepared from a laminate of an organic luminescent material and electrodes of opposite polarity, which devices include a single crystal material, such as single crystal anthracene, as the luminescent substance as described, for example, in U.S. Pat. No. 3,530,325. However, these devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507 and 4,720,432, wherein U.S. Pat. No. 4,720,432 discloses, for example, an organic EL device comprising a dual-layer hole injecting and transporting zone, one layer being comprised of porphyrinic compounds supporting hole injection and the other layer being comprised of aromatic tertiary amine compounds supporting hole transport. Another alternate device configuration illustrated in this patent is comprised of three separate layers, a hole transport layer, a luminescent layer, and an electron transport layer, which layers are laminated in sequence and are sandwiched between an anode and a cathode. Optionally, a fluorescent dopant material can be added to the emission zone or layer whereby the recombination of charges results in the excitation of the fluorescent.

There have also been attempts to obtain electroluminescence from organic light emitting devices containing mixed layers, for example, layers in which both the hole transport material and the emitting electron transport material are mixed together in one single layer, see, for example, J. Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities," *IEEE Transactions on Electron Devices* 44, pp. 1269–1281, 1997. In a number of such structures, the electron transport material and the emitting material are the same. However, as described in the S. Naka et al. article, these single mixed layer organic light emitting devices are generally less efficient than multi-layer organic light emitting devices. Recent EL research results indicate that those devices including only a single mixed layer of a hole transport material (composed of NBP, a naphthyl-substituted benzidine derivative) and an emitting electron transport material (composed of Alq$_3$, tris(8-hydroxyquinoline) aluminum are inherently believed to be unstable. The instability of these devices is believed to be caused by the direct contact between the electron transport material in the mixed layer and the hole injecting contact comprised of indium tin oxide (ITO), which results in the formation of the unstable cationic electronic transport material, and the instability of the mixed layer/cathode interface, see H. Aziz et al., *Science* 283, 1900 (1999), the disclosure of which is totally incorporated herein by reference.

Also, there have been attempts to obtain electroluminescence from organic light emitting devices by introducing a hole transport material and an emitting electron transport material as dopants in an inert host material, as reported in the above-described article by J. Kido et al. However, such known devices have been found to be generally less efficient than conventional devices including separate layers of hole transport material and emitting electron transport material.

While recent progress in organic EL research has perhaps elevated the potential of organic EL devices, the operational stability of current available devices may still be below expectations. A number of known organic light emitting devices have relatively short operational lifetimes before their luminance drops to some percentage of its initial value. Although known methods of providing interface layers as described, for example, in S. A. Van Slyke et al., "Organic Electroluminescent Devices with Improved Stability," *Appl. Phys. Lett.* 69, pp. 2160–2162, 1996, and doping as described, for example, Y. Hamada et al., "Influence of the Emission Site on the Running Durability of Organic Electroluminescent Devices", *Jpn. J. Appl. Phys.* 34, pp. L824–L826, 1995 may perhaps increase the operational lifetime of organic light emitting devices for room temperature operation, the effectiveness of these organic light emitting devices deteriorates dramatically for high temperature device operation. In general, device lifetime is reduced by a factor of about two for each 10° C. increment in the operational temperature. Moreover, at these high temperatures, the susceptibility of the organic light emitting devices is increased, as described, for example, in Zhou et al., "Real-time observation of temperature rise and thermal breakdown processes in organic LEDs using an IR imaging and analysis system", *Advanced Materials* 12, pp 265–269, 2000, which further reduces the stability of the devices. As a result, the operational lifetime of known organic light emitting devices at a normal display luminance level of about 100 cd/m$^2$ is limited, for example, to about a hundred hours or less at temperatures in the range of 60° C. to 80° C., reference J. R. Sheats et al., "Organic Electroluminescent Devices," *Science* 273, pp. 884–888, 1996, and also S. Tokito et al., "High-Temperature Operation of an Electroluminescent Device Fabricated Using a Novel Triphenlamine Derivative," *Appl. Phys. Lett.* 69,878 (1996).

SUMMARY OF THE INVENTION

This invention overcomes or minimizes many of the above-described disadvantages with regard to a number of existing organic light emitting devices (OLEDs) and provides in embodiments organic light emitting devices with enhanced operational lifetimes. In addition, the organic light emitting devices according to embodiments of the present invention can provide operational stability at high temperatures, such as, for example, an operational lifetime of several hundreds of hours, such as 1,200 hours up to several thousands of hours, such as about 10,000 hours for typical display luminance of about 100 cd/m$^2$ at temperatures of from about 80° C. to about 100° C. and above, device operation conditions. Accordingly, the organic light emitting devices of the present invention can be used for various numerous applications, and especially high temperature technological applications that usually require high temperature stability over long periods of times, such as, for example, about 500 to about 12,000 hours.

Organic light emitting devices according to this invention comprise, for example, in sequence;

(i) a substrate;

(ii) a first electrode;

(iii) a mixed region comprising a mixture of a hole transport material and an electron transport material, and wherein this mixed region comprises an organic luminescent material;

(iv) a second electrode;

(v) a thermal protective element coated on the second electrode wherein one of the two electrodes is a hole injection anode, and one of the two electrodes is an electron injection cathode, and wherein the organic light emitting device further comprises;

(vi) a hole transport region, interposed between the anode and the mixed region, wherein the hole transport region includes a buffer layer; and (vii) an electron transport region interposed between the cathode and the mixed region.

The mixed region, the hole transport region including the buffer layer, and the electron transport region can minimize or reduce changes in device luminance and/or driving voltage during device operation, and enable stability in the device luminance and/or driving voltage during device operation for extended periods of time at elevated temperatures, while the thermal protective coating increases the device resistance to shorting at elevated temperatures, and thus improves, for example, the thermal durability of the organic EL device.

In embodiments, the organic light emitting devices can further include an electron injection layer interposed between the electron transport region and the cathode. The electron injection layer can function to improve the injection of electrons from the cathode into the electron transport region, and therefore, the efficiency of the organic light emitting devices is increased.

An organic light emitting device according to this invention comprises a substrate, an anode laminated on the substrate, a hole transport region laminated on the anode, a buffer layer preferably situated in the hole transport region and in contact with the anode, a mixed region comprising a mixture of a hole transport material and an electron transport material laminated on the hole transport region, wherein the mixed region comprises an organic luminescent material, an electron transport region laminated on the mixed region, a cathode laminated on the electron transport region, and a thermal protective element or layer of, for example, a silicon oxide, inclusive of silicon oxides and silicon dioxides laminated on the cathode. Moreover, in embodiments the organic light emitting device according to this invention comprises a substrate, a cathode laminated on or situated upon the substrate, an electron transport region laminated on the cathode, a mixed region comprising a mixture of a hole transport material and an electron transport material and wherein the mixed region comprises an organic luminescent material, a hole transport region laminated on the mixed region wherein this region includes a buffer layer, an anode laminated on the hole transport region; and a thermal protective element laminated on the anode, wherein at least one of the hole transport material and the electron transport material comprising the mixed region is an organic luminescent material, wherein the mixed region further includes an organic luminescent material as a dopant, and wherein at least one of the hole transport material and the electron transport material in the mixed region can also be a luminescent material. The organic light emitting device can further comprise an electron injection layer interposed between the electron transport region and the cathode, and methods thereof, such as forming a mixed region comprising a mixture of a hole transport material and an electron transport material, wherein the mixed region contains an organic luminescent material, and wherein the mixed region is situated between a first electrode and a second electrode, and wherein the second electrode is coated with a thermal protective element, a hole transport region which includes a buffer layer and an electron transport region can be formed on the mixed region; and an optional electron injection layer in contact with the electron transport region, one of the first and second electrodes can be formed in contact with the hole transport region and serves as an anode and one of the first and second electrodes is formed in contact with either the electron transport region or the electron injection layer and serves as a cathode.

BRIEF DESCRIPTION OF THE DRAWINGS

Embodiments of this invention will be described in detail with reference to the following figures in which.

DETAILED DESCRIPTION OF EMBODIMENTS

Figure 2:
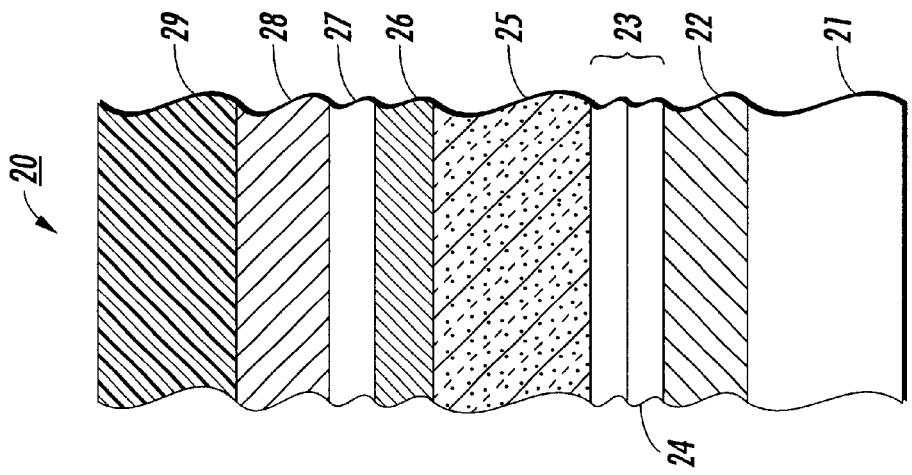
FIG. 2 illustrates embodiments of an organic light emitting device according to this invention including an electron injection layer.

This invention provides organic light emitting devices possessing in embodiments improved thermal stability and increased operational lifetimes as compared to a number of known organic light emitting devices. The organic light emitting devices according to this invention can be used in high temperature device operation conditions, such as, for example, temperatures in the range of about 70° C. to about 110° C., and more specifically, from about 80° C. to about 100° C., and wherein a device operational lifetime of at least several hundreds of hours, or even several thousands of hours, at these temperatures are desired.

The organic light emitting devices of this invention can be formed to emit various emission colors by selecting the hole transport material and electron transport material comprising a mixed region, and/or doping the mixed region with various selected emitting dopant materials. These dopant materials emit in a desired wavelength range and, thus, color range. The organic light emitting devices according to this invention can also be formed to achieve increased efficiency by interposing an electron injection layer between the electron transport region and the light cathode. The electron injection layer increases the injection of electrons from the cathode into the electron transport region and, as a result, the efficiency of the device can be further increased.

Aspects of the present invention relate to an organic light emitting device comprising in an optional sequence (i) a substrate;
(ii) a first electrode;
(iii) a mixed region comprising a mixture of a hole transport material and an electron transport material, and wherein this mixed region includes at least one organic luminescent material;
(iv) a second electrode;
(v) a thermal protective element coated on the second electrode, wherein one of the two said first and second electrodes is a hole injection anode, and one of the two said electrodes is an electron injection cathode, and wherein the organic light emitting device further comprises;
(vi) a hole transport region, interposed between the anode and the mixed region, wherein the hole transport region optionally includes a buffer layer; and
(vii) an electron transport region interposed between the second electrode and the mixed region; an organic light emitting device wherein the mixed region comprises from about 5 weight percent to about 95 weight percent of the hole transport material (iii); and from about 95 weight percent to about 5 weight percent of the electron transport material (iii), and at least one of the hole transport material and the electron transport material is an organic luminescent component; an organic light emitting device wherein the mixed region comprises from about 25 weight percent to about 75 weight percent of the hole transport material, and from about 75 weight percent to about 25 weight percent of the electron transport material, and wherein the total thereof is about 100 percent, and optionally wherein at least one of the hole transport material and the electron transport material is an organic luminescent material; an organic light emitting device wherein the mixed region (iii) comprises from about 5 weight percent to about 95 weight percent of the hole transport material, from about 95 weight percent to about 5 weight percent of the electron transport material, and from about 0.01 weight percent to about 25 weight percent of at least one organic luminescent dopant material, or wherein the mixed region (iii) comprises from about 25 weight percent to about 75 weight percent of the hole transport material, from about 75 weight percent to about 25 weight percent of the electron transport material, and from about 0.1 weight percent to about 5 weight percent of at least one organic luminescent dopant material; an organic light emitting device wherein the mixed region comprises from about 25 weight percent to about 75 weight percent of the hole transport material, from about 75 weight percent to about 25 weight percent of the electron transport material, and from about 5 weight percent to about 25 weight percent of at least one organic luminescent dopant material; an organic light emitting device wherein one surface of the buffer layer in the hole transport region (vi) is contacting the anode; an organic light emitting device wherein the hole transport material comprising the mixed region (iii) and the hole transport material comprising the hole transport region (vi) are comprised of similar or dissimilar components; and wherein the electron transport material comprising the mixed region (iii) and the electron transport material comprising the electron transport region (vii) are comprised of similar or dissimilar components; an organic light emitting device wherein the electron transport region is comprised of two or more layers; and optionally wherein the materials comprising the individual layers thereof are comprised of dissimilar components; an organic light emitting device further comprising an electron injection layer interposed between the electron transport region and the second electrode; an organic light emitting device wherein the thickness of the mixed region (iii) is from about 1 nanometers to about 1,000 nanometers; the thickness of the electron transport region (vii) is from about 5 nanometers to about 500 nanometers; the thickness of the thermal protective element is from about 1 nanometer to about 100 microns; the thickness of the hole transport region (vi) is from about 5 nanometers to about 500 nanometers; the thickness of the buffer layer in the hole transport region is from about 1 nanometer to about 100 nanometers; and optionally wherein the thickness of the buffer layer is at least about 1 nanometer less than the thickness of the hole transport region; an organic light emitting device wherein the thickness of the mixed region (iii) is from about 10 nanometers to about 200 nanometers; the thickness of the electron transport region (vii) is from about 10 nanometers to about 80 nanometers; the thickness of the thermal protective element is from about 10 nanometers to about 1000 nanometers; the thickness of the hole transport region is from about 20 nanometers to about 80 nanometers; the thickness of the buffer layer in the hole transport region is from about 5 nanometers to about 50 nanometers; and wherein the thickness of the buffer layer is at least 1 nanometer less than the thickness of the hole transport region; an organic light emitting device wherein the thickness of the hole transport region (vi) is from about 5 nanometers to about 20 nanometers greater than the thickness of the buffer layer in the hole transport region; an organic light emitting device wherein the thickness of the hole transport region is from about 20 nanometers to about 75 nanometers greater than the thickness of the buffer layer in the hole transport region, and wherein the thickness of the electron transport region is from about 5 nanometers to about 500 nanometers, wherein the thickness of each of the individual layers is at least about 1 nanometer, and further including an electron injector layer wherein the thickness of the electron injection layer is from about 1 nanometer to about 100 nanometers; an organic light emitting device wherein at least one hole transport material comprising at least one of the hole transport region and the mixed region (iii) is selected from the group consisting of aromatic tertiary amine compounds and indolocarbazole compounds; and at least one electron transport material comprising at least one of the electron transport region (vii) and the mixed region (iii) is selected from the group consisting of metal oxinoid compounds, stilbene derivatives, oxadiazole metal chelate compounds and triazine compounds; an organic light emitting device wherein the hole transport material is selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and the electron transport material is selected from the group consisting of tris(8-hydroxyquinoline) aluminum and bis(8-hydroxyquinolato)-(4-phenylphenolato)aluminum; an organic light emitting device wherein the buffer layer is comprised of a porphyrin compound or a metal oxide; an organic light emitting device wherein the porphyrin compound is copper phthalocyanine; an organic light emitting device wherein the thermal protective element is comprised of a porphyrin compound, a metal oxide, a metal of Ti, Cr, Ni or the alloys thereof; an organic light emitting device wherein the thermal protective element is selected from the group consisting of SiO, $SiO_2$, $ZrO_2$ and mixtures thereof; an organic light emitting device wherein the electron injection layer is comprised of a porphyrin compound, a metal oxide or an alkaline metal halide; an organic light emitting device wherein the alkaline metal halide is LiF; an organic light emitting device wherein at least one emitting dopant material is a fluorescent material or a phosphorescent material; an organic light emitting device wherein the at least one emitting dopant material is a fluorescent material selected from the group consisting of coumarin, dicyanomethylene pyranes, polymethine, oxabenzanthrane, xanthene, pyrylium, carbostyl, perylene, quinacridone, rubrene, anthracene, coronene, phenanthrecene, pyrene, butadiene, stilbene, lanthanide metal chelate complexes, rare-earth metal chelate complexes, 4-(dicyanomethylene)-2-l-propyl-6-(1,1,7,7-tetramethyljulolidyl-9-enyl)-4H-pyran, and derivatives thereof; an organic light emitting device wherein the emitting dopant material is selected from the group consisting of rubrene and N,N'-dimethylquinacridone, or wherein the emitting dopant material is a phosphorescent material selected from the group consisting of 2,3,7,8,12,13,17,18-octaethyl-21H23H-phorpine platinum(II) and fac tris(2-phenylpyridine)iridium; an organic light emitting device wherein the second electrode is a cathode coated with a thermal protective element, and the first electrode is an anode contacting a supportive substrate, or wherein the anode is coated with a thermal protective element; and the cathode is in contact with a supporting substrate; an organic light emitting device comprising (i) a substrate;

(ii) a first electrode in contact with the substrate;

(iii) a hole transport region in contact with the electrode, comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and which region further comprises a buffer layer contacting the first electrode, and optionally wherein the thickness of the buffer layer is from about 10 nanometers to about 30 nanometers, and the thickness of the hole transport region is from about 5 nanometers to about 20 nanometers greater than the thickness of the buffer layer;

(iv) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; from about 75 weight percent to about 25 weight percent of an electron transport material selected from the group consisting of tris(8-hydroxyquinoline) aluminum and bis(8-hydroxyquinolato)-(4-phenylphenolato)aluminum; and which region further comprises from about 0.1 weight percent to about 5 weight percent of a dopant material selected from the group consisting of rubrene N,N'-dimethylquinacridone, rubrene or 4-(dicyanomethylene)-2-l-propyl-6-(1,1,7,7-tetramethyljulolidyl-9-enyl)-4H-pyran, and optionally wherein thickness of the mixed region is from about 50 nanometers to about 150 nanometers;

(v) an electron transport region situated on the mixed region comprised of an electron transport material selected from the group consisting of tris(8-hydroxyquinoline) aluminum and bis(8-hydroxyquinolato)-(4-phenylphenolato)aluminum, and optionally wherein the thickness of the electron transport region is from about 10 nanometers to about 50 nanometers;

(vi) a second electrode situated on the electron transport region optionally comprised of a Mg:Ag or a Li:Al alloy of a thickness from about 50 nanometers to about 500 nanometers; and (vii) a thermal protective element situated on the second electrode comprised of metal oxides SiO, $SiO_2$ or mixtures thereof of a thickness of from about 100 nanometers to about 1.000 nanometers; an organic light emitting device and comprised of (i) a substrate;

(ii) an anode situated on the substrate comprised of indium-tin-oxide with a thickness of from about 30 to about 300 nanometers;

(iii) a hole transport region situated on the anode comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and further comprising a buffer layer contacting the anode and situated between the hole transport region and the anode, and wherein the thickness of the buffer layer is from about 10 nanometers to about 30 nanometers; and the thickness of the hole transport region is from about 5 nanometers to about 20 nanometers greater than the thickness of the buffer layer;

(iv) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and from about 75 weight percent to about 25 weight percent of an electron transport material selected from the group consisting of tris(8-hydroxyquinoline) aluminum and bis(8-hydroxyquinolato)-(4-phenylphenolato) aluminum; and further including from about 0.1 weight percent to about 5 weight percent of a dopant material selected from the group consisting of rubrene N,N'-dimethylquinacridone, rubrene or 4-(dicyanomethylene)-2-l-propyl-6-(1,1,7,7-tetramethyljulolidyl-9-enyl)-4H-pyran, and wherein the thickness of the mixed region is from about 50 nanometers to about 150 nanometers;

(v) an electron transport region situated on the mixed region comprised of an electron transport material selected from the group consisting of tris(8-hydroxyquinoline) aluminum and bis(8-hydroxyquinolato)-(4-phenylphenolato) aluminum, and wherein the thickness of the electron transport region is from about 10 nanometers to about 50 nanometers;

(vi) an electron injection layer situated on the electron transport region comprised of a thickness of from about 1 nanometer to about 3 nanometers;

(vii) a suitable second electrode situated on the electron injection layer comprised of a Al, Mg:Ag alloy or a Li:Al alloy, each of a thickness from about 50 nanometers to about 500 nanometers; and (viii) a thermal protective element on the second electrode comprised of SiO or $SiO_2$ of a thickness of from about 100 nanometers to about 1,000 nanometers; an organic light emitting device wherein (i) the first electrode, which is situated on the substrate, is comprised of an anode of indium-tin-oxide with a thickness of from about 30 to about 300 nanometers;

(ii) the hole transport region situated on the first electrode is comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and further comprising a buffer layer comprised of copper phthalocyanine and wherein the thickness of the buffer layer is from about 10 nanometers to about 30 nanometers, and the thickness of the hole transport region is from about 5 nanometers to about 20 nanometers greater than the thickness of the buffer layer;

(iii) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; from about 75 weight percent to about 25 weight percent of an electron transport material selected from the group consisting of tris(8-hydroxyquinoline) aluminum and bis(8-hydroxyquinolato)-(4-phenylphenolato) aluminum; and from about 0.1 weight percent to about 5 weight percent of a dopant material selected from the group consisting of rubrene N,N'-dimethylquinacridone, rubrene or 4-(dicyanomethylene)-2-l-propyl-6-(1,1,7,7-tetramethyljulolidyl-9-enyl)-4H-pyran and wherein the thickness of the mixed region is from about 50 nanometers to about 150 nanometers;

(iv) an electron transport region on the mixed region comprised of two layers and wherein the first layer contacting the mixed region is comprised of an electron transport material selected from the group consisting of tris(8-hydroxyquinoline) aluminum and bis(8-hydroxyquinolato)-(4-phenylphenolato)aluminum; and the second layer contacting the first layer is comprised of a triazine compound and wherein the thickness of the first layer of the electron transport region is from about 10 nanometers to about 30 nanometers; and the thickness of the second layer of the electron transport region is from about 5 nanometers to about 25 nanometers;

(v) a cathode situated on the electron transport region of a thickness of from about 50 nanometers to about 500 nanometers; and (vi) a thermal protective element on the cathode comprised of SiO, $SiO_2$ or mixtures thereof of a thickness of from about 100 nanometers to about 1,000 nanometers; a display comprising at least one organic light emitting device according to the present invention; an organic light emitting device wherein the protective element is SiO; an organic light emitting device wherein the protective element is $SiO_2$; an organic light emitting device wherein the thermal protective element is a single layer or a multiplicity of layers; an organic light emitting device wherein the thermal protective element is a metal oxide; an organic light emitting device wherein the metal oxide is aluminum oxide or zirconium oxide; an organic light emitting device wherein the first and the second electrode location is reversed; an organic light emitting device wherein the first electrode is an anode and the second electrode is a cathode.

Figure 1:
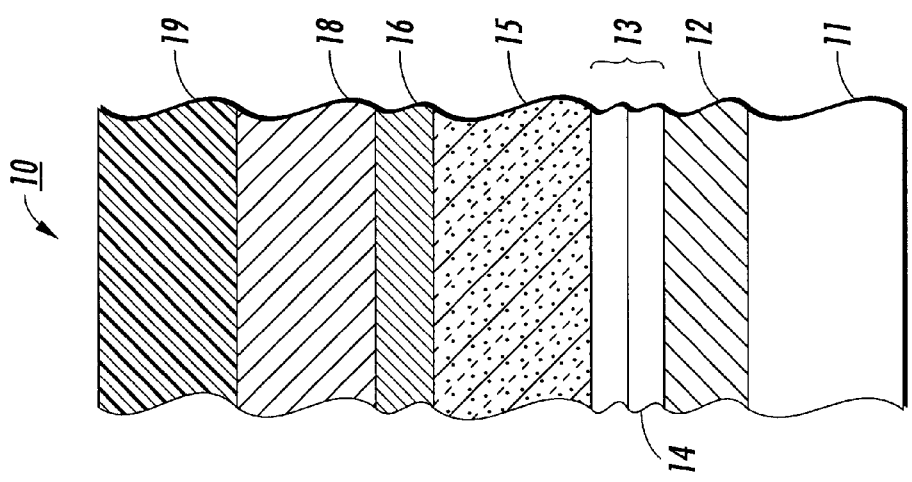
FIG. 1 illustrates exemplary embodiments of an organic light emitting device according to this invention.

An example of organic light emitting (EL) device according to this invention is illustrated in FIG. 1. The organic light emitting device 10 comprises: a substrate 11; an anode 12 on the substrate 11; a hole transport region 13 on the anode 12, comprised of at least one hole transport material, and further a buffer layer 14 comprised of a material with certain hole injection and transport properties, such as, for example, a porphyrin derivative compound, a mixed region 15 on the hole transport region 13 comprising a mixture of a hole transport material and an electron transport material and which mixed region includes an organic luminescent material, an electron transport region 16 situated on the mixed region 15 comprised of at least one electron transport material, a cathode 18 situated on the electron transport region 16, and a thermal protective element 19 situated on the cathode 18 comprised of at least one material with certain thermal properties such that the resistance of the organic light emitting device to shorting at elevated temperatures is increased, such protective layer being, for example, SiO, $SiO_2$ and mixtures thereof.

The organic light emitting devices according to this invention can comprise an electron injection layer in between the electron transport region and the cathode, reference FIG. 2 which illustrates an organic light emitting device 20 that further comprises an electron injection layer. The organic light emitting device 20 comprises a substrate 21, an anode 22 on the substrate 21, a hole transport region 23 on the anode 22 comprised of at least one hole transport material, and which further includes a buffer layer 24 comprised of a material with certain hole injection and transport properties such as, for example, a porphyrin derivative compound, a mixed region 25 on the hole transport region 23 comprising a mixture of a hole transport material and an electron transport material, and which mixed region includes an organic luminescent material, an electron transport region 26 on the mixed region 25 comprised of at least one electron transport material, an electron injection layer 27 on the electron transport region 26 comprised of at least one material that increases the injection of electrons into the electron transport region, such as, for example, a metal compound like LiF, KCl, MgO and the like, or an organic semiconductive compound, such as, for example, a porphyrin compound, like copper phthalocyanine, a conductive dopant such as, for example, Li, a cathode 28 on the electron injection layer 27, and a thermal protective element 29 on the cathode 28 comprised of at least one material with certain thermal properties such that the resistance of the organic light emitting device to shorting at elevated temperatures is increased, such as, for example, SiO, $SiO_2$ or mixtures thereof.

Figure 3:
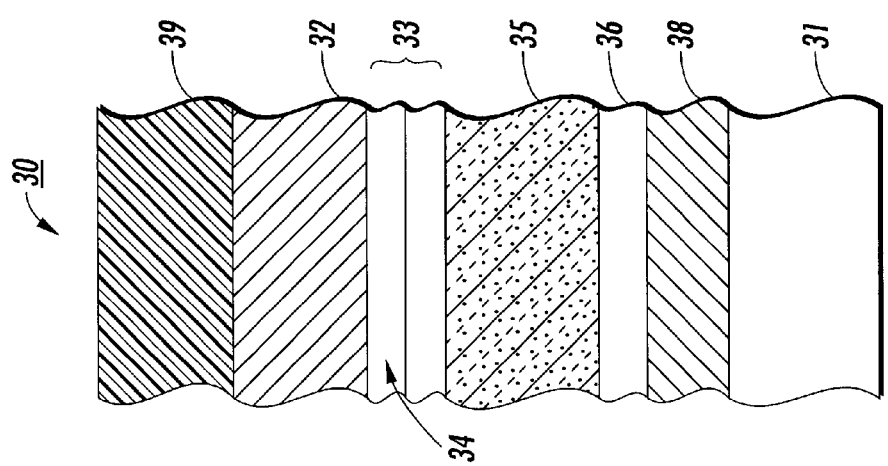
FIG. 3 illustrates embodiments of an organic light emitting device according to this invention.

In other embodiments organic light emitting devices according to this invention can be referred to as inverted organic light emitting device, that is, an organic light emitting device in which the cathode, instead of the anode, is contacting the substrate. FIG. 3 illustrates an exemplary embodiment of such an inverted organic light emitting device 30 according to this invention. The organic light emitting device 30 comprises a substrate 31, a cathode 38 on the substrate 31, an electron transport region 36 on the cathode 38 comprised of at least one electron transport material, a mixed region 35 on the electron transport region 36 comprising a mixture of a hole transport material and an electron transport material, and which mixed region includes an organic luminescent material, a hole transport region 33 on the mixed region 35 comprised of at least one hole transport material, and further includes a buffer layer 34 comprised of a material with certain hole injection and transport properties such as, for example, a porphyrin derivative compound; an anode 32 on the hole transport region 33, and a thermal protective element 39 on the anode 32 comprised of at least one material with certain thermal properties such that the resistance of the organic light emitting device to shorting at elevated temperatures is increased, and which protective element is, for example, SiO, $SiO_2$ and mixtures thereof.

Figure 4:
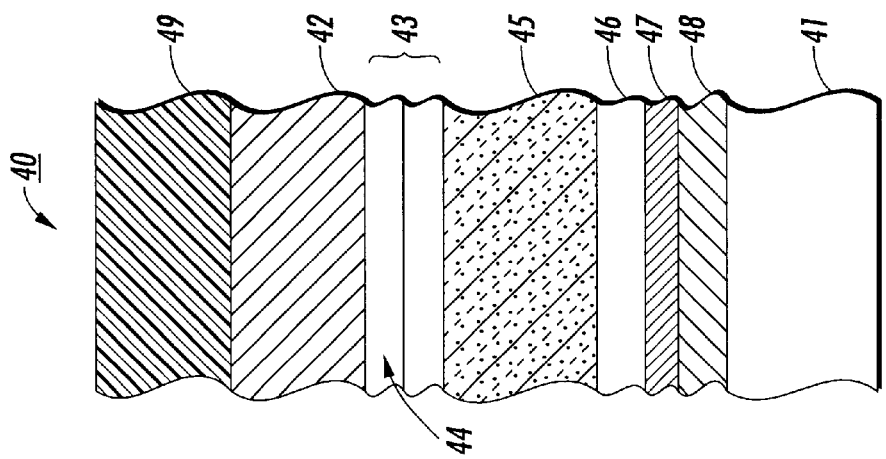
FIG. 4 illustrates embodiments of an organic light emitting device according to this invention including an electron injection layer.

The inverted organic light emitting devices according to this invention can further include an electron injection layer interposed between the electron transport region and the cathode. FIG. 4 illustrates an exemplary embodiment of such an inverted organic light emitting device 40 with an electron injection layer. The organic light emitting device 40 comprises a substrate 41, a cathode 48 on the substrate 41, an electron injection layer 47 on the cathode 48 comprised of at least one material that increases the injection of electrons from the cathode into the electron transport region, such as, for example, a metal compound like LiF, KCl, MgO and the like or an organic semiconductive compound, such as, for example, a porphyrin compound like copper phthalocyanine, which can further include a conductive dopant such as, for example, Li, an electron transport region 46 on the electron injection layer 47 comprised of at least one electron transport material, a mixed region 45 on the electron transport region 46 comprising a mixture of a hole transport material and an electron transport material, and which mixed region includes an organic luminescent material, a hole transport region 43 on the mixed region 45 comprised of at least one hole transport material, and further includes a buffer layer 44 comprised of a material with certain hole injection and transport properties and selected such that device performance is improved, such as, for example, a porphyrin derivative compound, an anode 42 on the hole transport region 43, and a thermal protective element 49 on the anode 42 comprised of at least one material with certain thermal properties such as, for example, SiO, $SiO_2$ and mixtures thereof.

The mixed region 15, 25, 35, and 45, the hole transport region 13, 23, 33, and 43 including the buffer layer 14, 24, 34, and 44, and the electron transport region 16, 26, 36, and 46 can function to primarily reduce the rate of decrease in the device luminance and/or the rate of increase in device driving voltage during device operation at elevated temperatures, such as, from about 80° C. to about 100° C. and above, for extended periods of time compared to a number of known organic light emitting devices, while the thermal protective element 19, 29, 39, and 49 primarily functions to increase the device resistance to shorting at elevated temperatures, and thus can improve the thermal durability of the organic EL device. In these embodiments, the buffer layer 14, 24, 34, and 44 can be located at any position within the hole transport region 13, 23, 33, and 43, respectively; that is, it can be located such that one surface of the buffer layer coincides with one surface of the hole transport region 13, 23, 33, and 43, and wherein the buffer layer 14, 24, 34, and 44 is contacting either the anode 12, 22, 32, and 42 or the mixed region 15, 25, 35, and 45; or it can be located such that the two surfaces of the buffer layer are in between the two surfaces of the hole transport region. However, one preferred embodiment is when the buffer layer 14, 24, 34, and 44 is contacting the anode 12, 22, 32, and 42.

In the organic light emitting devices according to embodiments of this invention, the electron transport region 16, 26, 36, and 46 can comprise a plurality of separate layers. Thus, the individual layers of the electron transport region 16, 26, 36, and 46 can be comprised of the same materials or of different materials. Typically, in such embodiments, the number of layers of the electron transport region 16, 26, 36, and 46 is from two to about ten. Preferably, the number of layers is two or three. The multiple-layered electron transport region 16, 26, 36, and 46 can in embodiments improve the operational performance of the organic light emitting devices. Particularly, these structures can improve the injection of the electrons into the mixed region 15, 25, 35, and 45, reduce the operating voltage and improve device stability. The electron injection layer 27 and 47 can further improve the injection of electrons into the electron transport region 26 and 46, and therefore improve the operational performance of the organic light emitting device 20 and 40, particularly, these layers can reduce the operating voltage and improve device stability. Also, in embodiments the organic light emitting devices can be fabricated to emit light having a broad range of wavelengths. By selection of suitable combinations and mixtures of the hole transport material and the electron transport material comprising the mixed region 15, 25, 35, and 45, which can further comprise at least one organic luminescent material as a dopant, light emission at wavelengths of from about 400 nanometers to about 700 nanometers can be achieved from the organic light emitting devices. One method to obtain various emission colors can be, for example, by means of doping the mixed region 15, 25, 35, and 45 by an emitting material of the desired emission color, such as for example, with dimethylquinacridone, rubrene or nile red fluorescent dyes as dopant materials to obtain green, amber or red emission colors from the organic light emitting devices. Another method to obtain various emission colors can be, for example, by selecting at least one of the hole transport material and the electron transport material comprising the mixed region 15, 25, 35, and 45 to be a luminescent material of a desired emission color; in this situation the mixed region 15, 25, 5, and 45 may further include a luminescent dopant to further adjust the emission color or even to obtain a new color as desired. Accordingly, the organic light emitting devices of this invention can emit light having a range of different colors by appropriate material selection. Thus, the organic light emitting devices of this invention can be used in various applications where certain specific light colors, such as red, green or blue, are desired. Further, in these embodiments, the hole transport material of the mixed region 15, 25, 35, and 45 and the hole transport material of the hole transport region 13, 23, 33, and 43 can be the same material or a different material. Furthermore, the electron transport material of the mixed region 15, 25, 35, and 45 and the electron transport material of the electron transport region 16, 26, 36, and 46 can be the same material or a different material.

Moreover, in embodiments the organic light emitting devices can be operated under alternating current (AC) and/or direct current (DC) driving conditions. AC driving conditions are preferred to provide extended operational lifetimes, especially in high temperature device operation conditions. Preferred ranges for operating voltage includes, for example, from about 3 to about 20 volts, and more preferably from about 5 to about 15 volts. Preferred ranges for driving currents include, for example, from about 1 to about 1,000 mA/cm$^2$ density, and more preferably from about 10 mA/cm$^2$ to about 200 mA/cm$^2$. Driving voltages and currents outside of these ranges can also be used it is believed.

The substrate such as 11, 21, 31, and 41 can comprise various suitable materials including, for example, polymeric components, glass, quartz and the like. Suitable polymeric components include, but are not limited to polyesters, such as MYLAR®, polycarbonates, polyacrylates, polymethacrylates, polysulfones, and the like. Mixtures of these various materials can also be used. Other substrate materials can also be selected provided, for example, that the materials can effectively support the other layers, and do not substantially interfere with the device functional performance. Preferably, in embodiments, the substrate is formed of a light transmission material.

The thickness of the substrate 11, 21, 31, and 41 is not particularly limited except, for example, perhaps by the structural demands of the organic light emitting device and its intended use. Suitable thicknesses include, for example, from at least about 25 $\mu$m to about 10,000 $\mu$m, and preferably from about 100 $\mu$m to about 1,000 $\mu$m.

The anode of, for example, 12, 22, 32, and 42 can comprise suitable positive charge injecting electrodes, such as indium tin oxide (ITO), tin oxide, gold and platinum. Other suitable materials for the anode include, but are not limited to, electrically conductive carbon, $\pi$-conjugated polymers such as polyaniline, polythiophene, polypyrrole, and the like having, for example, a work function equal to, or greater than, about 4 eV, and preferably from about 4 eV to about 6 eV.

The anode 12, 22, 32, and 42 can be of any suitable form. A thin conductive layer can be coated onto a substrate, for example a transparent or substantially transparent glass plate or plastic film, such as, for example, in organic light emitting devices 10, and 20 of FIGS. 1 and 2, respectively, or a thin conductive layer coated on the hole transport region 33, 43 in organic light emitting devices 30 and 40 of FIGS. 3 and 4, respectively. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and preferably from about 75 Å to about 150 Å can be used. These thin anodes can comprise metals such as gold, palladium and the like. In addition, transparent or semitransparent thin layers of conductive carbon or conjugated polymers, such as polyaniline, polythiophene, polypyrrole and the like, having a thickness of, for example, from 50 Å to about 175 Å can be used as anodes. Additional suitable forms of the anode 12, 22, 32, and 42 (and the cathode 18, 28, 38, and 48) are disclosed in U.S. Pat. No. 4,885,211, the disclosure of which is incorporated herein by reference in its entirety.

The thickness of the anode 12, 22, 32, and 42 can range from about 1 nanometer to about 5,000 nanometers with the preferred range depending on the optical constants of the anode material. One preferred range of thickness of the anode is from about 30 nanometers to about 300 nanometers. Thicknesses outside of this range can also be used it is believed. The anode 12, 22, 32, and 42 can be formed using any suitable thin film forming method, such as vapor deposition in vacuum, spin-coating, electron-beam deposition and sputtering deposition.

The hole transport material selected to form the hole transport region 13, 23, 33, and 43 and the mixed region 15, 25, 35, and 45 can be any suitable known or later developed material. Suitable hole transport materials include, but are not limited to, conductive materials such as polyaniline and its acid-doped forms, polypyrrole, poly(phenylene vinylene), and other suitable semiconductive organic materials. Mixtures of these and other suitable materials can also be used. A preferred class of hole transporting materials are the aromatic tertiary amines such as those disclosed in U.S. Pat. No. 4,539,507, the disclosure of which is totally incorporated herein by reference. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like.

Another class of aromatic tertiary amines selected for the hole transport material is the polynuclear aromatic amines. Examples of such polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

A further class of hole transporting materials are 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, with a preferred class of the hole transport materials being the indolo-carabazoles, such as, for example, 5,11-di-naphthyl-5,11-dihydroindolo[3,2-b]carbazole and 2,8-dimethyl-5,11-di-naphthyl-5,11-dihydroindolo[3,2-b] carbazole, and others as those described in incorporated U.S. Pat. No. 5,942,340, the disclosure of which is totally incorporated herein by reference; N,N,N'N'-tetraarylbenzidines wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transport materials also include the naphthyl-substituted benzidine derivatives.

The hole transport region 13, 23, 33, and 43 can further comprise at least one buffer layer 14, 24, 34, and 44 comprised of a material with certain hole injection and transport properties, and selected such that, for example, device performance is improved. Suitable materials that can be utilized in the buffer layer 14, 24, 34, and 44 include semiconductive organic materials, such as, for example, porphyrin derivatives like 1,10,15,20 -tetraphenyl-21H, 23H-porphyrin copper (II) disclosed in U.S. Pat. No. 4,356,429, the disclosure of which is totally incorporated herein by reference; copper phthalocyanine, copper tetramethyl phthalocyanine, zinc phthalocyanine, titanium oxide phthalocyanine, magnesium phthalocyanine, and the like, and wherein copper phthalocyanine is one preferred example. Mixtures of these and other suitable materials can also be used. Other suitable materials that can be utilized in the buffer layer 14, 24, 34, and 44 include semiconductive and insulative metal compounds, such as for example metal oxides like $MgO$, $Al_2O_3$, $BeO$, $BaO$, $AgO$, $SrO$, $SiO$, $SiO_2$, $ZrO_2$, $CaO$, $Cs_2O$, $Rb_2O$, $Li_2O$, $K_2O$ and $Na_2O$; and metal halides like $LiF$, $KCl$, $NaCl$, $CsCl$, $CsF$ and $KF$.

The hole transport region 13, 23, 33, and 43 including the buffer layer 14, 24, 34, and 44 can be prepared by forming, for example, one of the above-described materials into thin films by any suitable known or later developed method. Suitable methods for this purpose include, for example, vapor deposition and spin coating techniques.

The buffer layer 14, 24, 34, and 44 can be located at any position within the hole transport region 13, 23, 33, and 43, that is, it can be located such that one surface of the buffer layer coincides with one surface of the hole transport region 13, 23, 33, and 43; in this situation the buffer layer 14, 24, 34, and 44 is contacting either the anode 12, 22, 32, and 42 or the mixed region 15, 25, 35, and 45, or it can be located such that the two surfaces of the buffer layer are in between the two surfaces of the hole transport region. However, in embodiments the buffer layer 14, 24, 34, and 44 is in contact with the anode 12, 22, 32, and 42.

The hole transport region 13, 23, 33, and 43 including the buffer layer 14, 24, 34, and 44 can have a thickness ranging from about 5 nanometers to about 500 nanometers. The buffer layer 14, 24, 34, and 44 can have a thickness ranging from about 1 nanometer to about 100 nanometers. The thickness of the buffer 14, 24, 34, 44 layer is, for example, at least 1 nanometer less than the thickness of the hole transport region 13, 23, 33, and 43. A preferred thickness range for the buffer layer 14, 24, 34 and 44 is from about 5 nanometers to about 25 nanometers. Another preferred thickness range for the buffer layer 14, 24, 34 and 44 is from about 1 nanometer to about 5 nanometers.

From Z. D. Popovic et al., *Proceedings of the SPIE,* Vol. 3176, "Organic Light-Emitting Materials and Devices II," San Diego, Calif., Jul. 21–23, 1998, pp. 68–73, the disclosure of which is totally incorporated herein by reference, and U.S. patent application Ser. No. 09/357,551, filed on Jul. 20, 1999, the disclosure of which is totally incorporated herein by reference, it is known that the thickness of the hole transport region 13, 23, 33, and 43 may have an influence on the performance of the organic light emitting device. It has also been determined that the thickness of the hole transport region exclusive of the thickness of the buffer layer in the hole transport region also has an influence of the performance of the device where, in general, reducing the thickness of the hole transport region without reducing the thickness of the buffer layer in it can lead to a desirable increase in device stability and, in the same time, to an undesirable decrease in device efficiency. There is, therefore, a desirable thickness range for the hole transport region 13, 23, 33, and 43 for a particular thickness of the buffer layer 14, 24, 34, and 44 in that region. A preferred thickness range for the hole transport region 13, 23, 33, and 43, exclusive of the thickness of the buffer layer 14, 24, 34, and 44 (the remaining thickness of the hole transport region after the thickness of the buffer layer is substracted) is from about 5 nanometers to about 15 nanometers. Another preferred thickness range for the hole transport region 13, 23, 33, and 43, exclusive of the thickness of the buffer layer 14, 24, 34, and 44 is from about 15 nanometers to about 75 nanometers.

The electron transport material selected to form the electron transport region 16, 26, 36, and 46 and the mixed region 15, 25, 35, and 45 can be any suitable known or later developed material. Suitable electron transport materials that can be used in the electron transport region 16, 26, 36, and 46 and the mixed region 15, 25, 35, and 45 include the metal oxinoid compounds, such as the metal chelates of 8-hydroxyquinoline as disclosed in U.S. Pat. Nos. 4,539,507; 5,151,629; 5,150,006 and 5,141,671, the disclosures of each being totally incorporated herein by reference. Illustrative examples include tris(8-hydroxyquinolinate) aluminum ($Alq_3$), which is a preferred electron transport material. Another preferred example is bis(8-hydroxyquinolato)-(4-phenylphenolato)aluminum (Balq). Other examples include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h] quinolinate) beryllium, and the like.

Other classes of electron transport materials that can be used in the electron transport region 16, 26, 36, and 46 and the mixed region 15, 25, 35, and 45 comprise stilbene derivatives, such as those disclosed in U.S. Pat. No. 5,516,577, the disclosure of which is totally incorporated herein by reference; a preferred stilbene derivative is 4,4'-bis(2,2-diphenylvinyl)biphenyl; the electron transport materials comprised of the metal thioxinoid compounds such as those illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc; and for region 16, 26, 36, and 46 and the mixed region 15, 25, 35, and 45 the oxadiazole metal chelates disclosed in U.S. Pat. No. 5,925,472, the disclosure of which is totally incorporated herein by reference, such as bis[2-(2-hydroxyphenyl)-5-phenyl-1,3,4-oxadiazolato]zinc; bis[2-(2-hydroxyphenyl)-5-phenyl-1,3,4-oxadiazolato] beryllium; bis[2-(2-hydroxy phenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[(2-hydroxyphenyl)-5-phenyl-1,3,4-oxadiazolato] lithium; bis [2-(2-hydroxyphenyl)-5-p-tolyl-1,3,4-oxadiazolato]zinc; bis [2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis [2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; the triazines illustrated in U.S. Pat. No. 6,057,048 and U.S. patent application Ser. No. 09/489,144, filed on Jan. 21, 2000, the disclosures of each being totally incorporated herein by reference; and the class of materials for mixed region 15, 25, 35, and 45 are the anthracene derivatives.

The mixed region 15, 25, 35, and 45 can further comprise one or more organic luminescent materials as dopants. Illustrative examples of the dopant materials that can be utilized, for example, in the mixed region 15, 25, 35, and 45 include dyes such as coumarin, dicyanomethylene pyranes, polymethine, oxabenzanthrane, xanthene, pyrylium, carbostyl, perylene, and the like; dyes selected from the quinacridone derivatives of, for example, the Formula

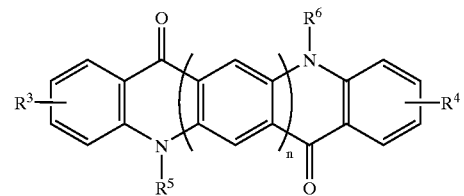

wherein $R^3$ and $R^4$ are independently hydrogen, alkyl, alkoxyl, aryl, fused aryl, such as naphthyl, or halogen; $R^5$ and $R^6$ are independently hydrogen, alkyl or aryl; and n equals 0, 1, 2 or 3. Illustrative examples of suitable quinacridone dyes include N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone. Another class of fluorescent materials are the quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like, as described in U.S. Pat. Nos. 5,227,252; 5,276,381 and 5,593,788, the disclosures of which are each incorporated herein by reference.

A class of dopant materials that can also be utilized in the mixed region 15, 25, 35, and 45 are the fused ring fluorescent dyes. Examples of the fused ring fluorescent dyes include perylene, rubrene, anthracene, coronene, phenanthrecene, pyrene and the like, as described in U.S. Pat. No. 3,172,862, the disclosure of which is totally incorporated herein by reference. Fluorescent materials that can be used as a dopant include butadienes, such as 1,4-diphenylbutadiene and tetraphenyl butadiene, stilbenes and the like, as described in U.S. Pat. Nos. 4,356,429 and 5,516,577, the disclosures of which are totally incorporated herein by reference. Other examples of dopant materials are those described in U.S. Pat. No. 5,601,903, the disclosure of which is totally incorporated herein by reference. Other fluorescent dyes that can be utilized in the mixed region 15, 25, 35, and 45 include those disclosed in U.S. Pat. No. 5,935,720, the disclosure of which is totally incorporated here by reference, such as, for example, 4-(dicyanomethylene)-2-1-propyl-6-(1,1,7,7-tetramethyljulolidyl-9-enyl)-4H-pyran (DCJTB). Another class of dopant materials that can be utilized in the mixed region 15, 25, 35, and 45 is the lanthanide metal chelate complexes, such as for example, tris(acetylacetonato)(phenanthroline) terbium, tris(acetyl acetonato)(phenanthroline) europium, and tris(thenoyl trisfluoroacetonato)(phenanthroline) europium, and those disclosed in Kido et al., "White light emitting organic electroluminescent device using lanthanide complexes", *Jpn. J. Appl. Phys.,* Volume 35, pp. L394–L396 (1996). A preferred class of dopant materials that can be utilized in the mixed region 15, 25, 35, and 45 is the phosphorescent materials, such as, for example, organometallic compounds containing a heavy metal atom that lead to strong spin-orbit coupling, such as those disclosed in Baldo et al., "Highly efficient organic phosphorescent emission from organic electroluminescent devices", *Letters to Nature,* Volume 395, pp 151–154 (1998). Preferred examples include 2,3,7,8,12,13,17,18-octaethyl-21H,23H-phorpine platinum(II) (PtOEP) and fac tris(2-phenylpyridine) iridium (Ir(ppy)$_3$).

According to this invention, in embodiments thereof the mixed region 15, 25, 35, and 45 can comprise from about 5 weight percent to about 95 weight percent of the hole transport material, and from about 95 weight percent to about 5 weight percent of the electron transport material. The mixed region 15, 25, 35, and 45 can further comprise from about 0.01 weight percent to about 25 weight percent of the dopant material. Preferably, the mixed region 15, 25, 35, and 45 comprises from about 30 weight percent to about 70 weight percent of the hole transport material, from about 70 weight percent to about 30 weight percent of the electron transport material, and can further comprise from about 0.05 weight percent to about 10 weight percent of a dopant material. Another range amount in the mixed region 15, 25, 35, and 45 is from about 40 weight percent to about 60 weight percent of the hole transport material, from about 60 weight percent to about 40 weight percent of the electron transport material and from about 0.1 weight percent to about 2 weight percent of the dopant material; from about 0.2 weight percent to about 1 weight percent. Another preferred range amount for the dopant material in the mixed region 15, 25, 35, and 45 is from about 5 weight percent to about 20 weight percent.

The mixed region 15, 25, 35, and 45 can be formed using mixtures of any of the suitable exemplary hole transport materials, electron transport materials, and dopant materials described herein. The mixed region 15, 25, 35, and 45 can be formed by any suitable method that enables the formation of selected mixtures of the hole transport materials, electron transport materials and dopant materials. For example, the mixed region 15, 25, 35, and 45 can be formed by co-evaporating the hole transport material, electron transport material, and dopant material to form the mixed region 15, 25, 35, and 45.

The thickness of the mixed region 15, 25, 35, and 45 can vary from, for example, about 1 nanometer to about 1000 nanometers. The thickness of the mixed region 15, 25, 35, and 45 is typically from about 10 nanometers to about 200 nanometers. Preferably, the thickness of the mixed region 15, 25, 35, and 45 is from about 20 nanometers to about 100 nanometers. However, thicknesses outside of these ranges may also be used. The mixed region 15, 25, 35, and 45 can comprise more than one layer. For example, the mixed region 15, 25, 35, and 45 can selectively be formed to include two, three or even more separate layers. In these embodiments, the mixing ratios of the hole transport material and the electron transport material can be the same in each of the layers, or the mixing ratios can be varied in the layers. For example, the multiple layers can each comprise an equal weight percentage of the hole transport material and the electron transport material. In other embodiments, the mixed region can comprise different amounts of these materials.

The electron transport region 16, 26, 36, and 46 can comprise an electron transport material with a thickness ranging, for example, from about 5 nanometers to about 500 nanometers. Preferably, this thickness is from about 20 nanometers to about 80 nanometers. A thickness outside of these ranges can also be used it is believed. In embodiments such as with the organic light emitting device comprising a multiple-layered electron transport region, the individual layers have a thickness of at least about 1 nanometer.

The electron injection layer 27 and 47 can comprise at least one material that increases the injection of electrons from the cathode into the electron transport region. Illustrative examples of materials that can be used in the electron injection layer 27 and 47 include, but are not limited to, metal compound and suitable organic semiconductive materials.

Suitable metal compounds that can be utilized in the electron injection layer 27 and 47 include the alkaline earth metal oxides like SrO, CaO, BaO and others, such as those disclosed in U.S. Pat. Nos. 5,457,565 and 5,739,635, the disclosures of which are totally incorporated herein by reference, and other metal oxides such as $Al_2O_3$, SiO and $SiO_2$. A preferred class of metal compounds that can be utilized in the electron injection layer 27 and 47 are the alkaline metal halides, such as, for example, LiF, LiCl, NaCl, KF, KCl and others as those disclosed in the above referenced U.S. Pat. No. 5,739,635 and also those disclosed in U.S. Pat. No. 5,776,622, the disclosures of which are totally incorporated herein by reference.

Suitable organic semiconductive materials that can be used in the electron injection layer 27 and 47 include materials or components that permit high energy deposition of the cathode. Examples of these materials can be selected from the porphyrin and the naphthacene compounds of which copper phthalocyanine is one preferred example. The electron injection layer 27 and 47 can further include at least one dopant comprised of an electron injecting dopant, such as for example Li.

The electron injection layer 27 and 47 can have a thickness ranging, for example, from about 1 nanometer to about 100 nanometers. One preferred thickness range for the electron injection layer is from about 1 nanometer to about 10 nanometers. Another preferred thickness range for the electron injection layer is from about 10 nanometers to about 100 nanometers. The electron injection layer 27 and 47 can be formed using any suitable thin film forming method, such as vapor deposition in vacuum, electron-beam deposition and sputtering deposition, wherein the vapor deposition in vacuum is a preferred method.

The cathode 18, 28, 38 and 48 can comprise any suitable metal, including high work function components, having a work function, for example, from about 4 eV to about 6 eV, or low work function components, such as metals with, for example, a work function of from about 2.5 eV to about 4.eV. The cathode can comprise a combination of a low work function (less than about 4 eV) metal and at least one other metal. Effective proportions of the low work function metal to the second or other metal are from less than about 0.1 weight percent to about 99.9 weight percent, and more specifically, from about 3 to about 45 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes of U.S. Pat. No. 4,885,211, the disclosure of which is totally incorporated herein by reference, disclose one preferred cathode construction. Another cathode construction is described in U.S. Pat. No. 5,429,884, the disclosure of which is totally incorporated herein by reference, wherein the cathodes are formed from lithium alloys with other high work function metals such as aluminum and indium. Another preferred material for the cathode 18, 28, 38 and 48 is aluminum metal.

The cathode 18, 28, 38 and 48 can comprise at least one transparent conducting material, such as for example, indium-tin-oxide (ITO), and other materials, such as, for example, those disclosed in U.S. Pat. Nos. 5,703,436 and 5,707,745, the disclosures of which are totally incorporated herein by reference.

The thickness of the cathode 18, 28, 38 and 48 can range from, for example, about 10 nanometers to about 500 nanometers, and more specifically, from about 25 to about 300 nanometers, although thicknesses outside of these ranges may be used. The cathode 18, 28, 38 and 48 can be formed using any suitable thin film forming method. Preferred methods for forming the cathode 18, 28, 38 and 48 include vapor deposition in vacuum, electron-beam deposition and sputtering deposition.

The thermal protective element, such as 19, 29, 39 and 49, is formed of at least one layer comprising at least one material with certain thermal properties. Among the desired thermal properties of the materials comprising the thermal protective element 19, 29, 39 and 49 are the thermal expansion properties, where certain ranges for these properties are preferred, such as, for example, less than about $9 \times 10^{-6}$ (° $C.^{-1}$), and preferably, for example, less than about $4 \times 10^{-6}$ (° $C.^{-1}$) with no specific lower limits to these properties. The preferred ranges are selected based on the thermal properties of the other materials comprising the organic light emitting device, especially the thermal properties of the materials comprising the substrate 11, 21, 31 and 41, the hole transport region 13, 23, 33, 43 and the mixed region 15, 25, 35 and 45, and the electron transport region 16, 26, 36 and 46, so that the susceptibility of the organic EL device to shorting at high temperatures is eliminated, minimized, or substantially reduced.

The materials utilized in the thermal protective element, such as 19, 29, 39, and 49, can be selected from any suitable class of materials, such as, for example, organic compounds, inorganic materials, metallic materials, and mixtures thereof. Illustrative examples of materials that can be utilized in the thermal protective element are disclosed in copending application U.S. Ser. No.09/0777154, the disclosure of which is totally incorporated herein by reference, of which metal oxides, such as, for example, $Al_2O_3$, SiO, $SiO_2$, $ZrO_2$, are preferred examples. The thickness of the thermal protective element 19, 29, 39, and 49 can be from about 1 nanometer to about 100 microns, although there may be no upper limit to the thickness except as may be required due to limitations in the fabrication technique or as may be required to avoid detrimental effects on other performance characteristics of the EL device or added costs. A preferred thickness range for the thermal protective element 19, 29, 39, and 49 is, for example, from about 10 nanometers to about 1,000 nanometers.

The thermal protective element of, for example, 19, 29, 39, and 49 can be prepared by forming one of the above-described materials into thin films by any suitable known or later developed method. Suitable methods for this purpose include, for example, vapor deposition, sputtering, electron beam, arc evaporation and spin coating techniques. Of these methods, vapor deposition and sputtering are preferred.

Element refers, for example, to a single layer, a number of separate layers, or one composite layer comprised of a number of layers, reference copending application U.S. Ser. No. 09/770,154, the disclosure of which is totally incorporated herein by reference.

The following Examples are provided to further illustrate various aspects of the present invention, and are not intended to limit the scope of the invention.

EXAMPLE I

Example to Demonstrate the High Operational Stability at 100° C.

An organic light emitting device having a structure, such as device 10 in FIG. 1, was formed and evaluated. In this device a naphthyl-substituted benzidine derivative, N,N'-di-1-naphthyl-N,N'-diphenyl-1,1'-biphenyl-4,4'-diamine (NPB), and tris(8-hydroxyquinoline) aluminum ($Alq_3$), was used as the hole transport material and the electron transport material, respectively, comprising the hole transport 13 region, the mixed region 15, and the electron transport region in the organic light emitting device 16. The mixed region 15 was comprised of about 49.5 weight percent of NPB, about 49.5 weight percent of $Alq_3$ and further about 1 weight percent of rubrene as an emitting dopant material. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers, the thickness of the hole transport region 13 was about 25 nanometers, the thickness of the mixed region 15 was about 80 nanometers, the thickness of the electron transport region 16 was about 20 nanometers, and the thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers precoated on a glass substrate 11, and a cathode 18 comprised of a Mg:Ag (10:1 by weight) alloy having a thickness of about 120 nanometers.

The organic light emitting device was fabricated using a vacuum evaporation process at a pressure of about 6×10$^{-6}$ Torr. The mixed region 15 was produced by co-evaporation of pure NPB, pure Alq$_3$, and pure rubrene from separate sources, with the single evaporation rates being varied between about 0.1–10 Å/s to obtain the desired mixing ratio of the mixed region 15.

Following formation of the organic hole transport region 13, the mixed region 15 and the electron transport region 16, the metal cathode 18 was deposited on the electron transport region 16 without breaking the vacuum.

The operational lifetime was tested with the organic light emitting device operated at a temperature of 100° C. in nitrogen gas under AC driving conditions at an average constant current density of 31.25 mA/cm$^2$. At this current density, the initial luminance of the organic light emitting device was about 1,710 cd/m$^2$.

From operational lifetime tests, the device half-life (the time elapsed before the device luminance decreases to half the initial luminance), from an initial luminance of about 1,710 cd/m$^2$ was found to be about several thousand hours, and more specifically, 8,500 hours under normal operating conditions as illustrated herein; and 500 hours for continuous device operation at a temperature of 100° C. Since the device half-life was measured at an initial luminance of about 1,710 cd/m$^2$, which is about 17.1 times a typical normal display luminance of 100 cd/m$^2$ under normal conditions, the measured half-life of 500 hours represents an accelerated half-life under high stressing conditions at 100° C., which corresponds to a half-life of about 8,500 hours (17.1×500 hours) at 100° C. under a typical display luminance of 100 cd/m$^2$ (candela per square meter). This Example demonstrates that an organic light emitting device according to embodiments of this invention can be used in applications when a device half-life of several thousands of hours at an initial luminance of about 100 cd/m$^2$ at high temperature operation conditions, such as, for example, temperatures ranging from about 80° C. to about 100° C. or above is selected. In contrast, the half-life of a prior art organic light emitting device was limited to about 100 hours or less, at an initial luminance of 100 cd/m$^2$, at high temperatures, reference, for example, the prior art EL device of J. R. Sheats et al., "Organic Electroluminescent Devices," *Science* 273, pp. 884–888, 1996, and also S. Tokito et al., "High-Temperature Operation of an Electroluminescent Device Fabricated Using a Novel Triphenlamine Derivative," *Appl. Phys. Lett.* 69, 878 (1996). More specifically, there was evaluated a prior art organic light emitting device comprised of an emitting region comprised of a hole transport region, formed of N,N'-di-1-naphthyl-N, N'-diphenyl-1,1'-biphenyl-4,4'-diamine (NPB; and an emitting electron transport region formed of about 99 weight percent of tris(8-hydroxyquinoline) aluminum (Alq$_3$) and about 1 weight percent of rubrene as an emitting dopant. The thickness of the hole transport region was about 60 nanometers, and the thickness of the emitting electron transport region was about 75 nanometers. The hole transport region and the emitting electron transport region were formed between an anode comprised of indium-tin-oxide (ITO) having a thickness of about 200 nanometers, precoated on a glass substrate; and a cathode comprised of a Mg:Ag (10:1 by weight) alloy having a thickness of about 120 nanometers. The organic light emitting device was fabricated using a vacuum evaporation process at a pressure of about 6×10$^{-6}$ Torr. The emitting electron transport region was produced by co-evaporation of pure Alq$_3$ and pure rubrene from separate sources, with the single evaporation rates being varied between about 0.1–10 Å/s to obtain the desired mixing ratio.

Following formation of the organic hole transport region and the emitting electron transport region, the metal cathode was deposited on the emitting electron transport region without breaking the vacuum.

The operational lifetime was tested with the organic light emitting device operated at a temperature of 100° C. in nitrogen gas under AC driving conditions at an average constant current density of 31.25 mA/cm$^2$. At this current density, the initial luminance of the organic light emitting device was about 1,280 cd/m$^2$.

From operational lifetime tests, the device half-life (the time elapsed before the device luminance decreases to half the initial luminance), from an initial luminance of about 1,280 cd/m$^2$ was found to be about 100 hours, and more specifically, 102 hours under normal operating conditions as described herein below; and only 8 hours for continuous device operation at a temperature of 100° C. Since the device half-life is measured at an initial luminance of about 1,280 cd/m$^2$, which is about 12.8 times a typical normal display luminance of 100 cd/m$^2$ under normal conditions, the measured half-life of 8 hours represents an accelerated half-life under high stressing conditions at 100° C., which corresponds to a half-life of about 102 hours (12.8×8 hours) at 100° C. under a typical display luminance of 100 cd/m$^2$ (candela per square meter).

EXAMPLE II

Example to Demonstrate the Higher Operational Stability at 100° C. of Devices According to this Invention in Comparison to a Prior Art Device A first group of organic light emitting devices having a structure, such as the device 10 in FIG. 1, were formed and evaluated. In these devices, a naphthyl-substituted benzidine derivative, N,N'-di-1-naphthyl-N,N'-diphenyl-1,1'-biphenyl-4,4'-diamine (NPB), and tris(8-hydroxyquinoline) aluminum (Alq$_3$), was used as the hole transport material and the electron transport material, respectively, comprising the hole transport 13 region, the mixed region 15, and the electron transport region in the organic light emitting device 16. The mixed region 15 was comprised of about 49.5 weight percent of NPB, about 49.5 weight percent of Alq$_3$, and further comprised of about 1 weight percent of rubrene as an emitting dopant material. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers, the thickness of the hole transport region 13 was about 25 nanometers, and the thickness of the mixed region 15 was about 80 nanometers. The thickness of the electron transport region 16 was about 20 nanometers. The thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers, precoated on a glass substrate 11, and a cathode 18 comprised of a Mg:Ag (10:1 by weight) alloy having a thickness of about 120 nanometers.

The organic light emitting devices were fabricated using a vacuum evaporation process at a pressure of about 6×10$^{-6}$ Torr. The mixed region 15 was produced by co-evaporation of pure NPB, pure Alq$_3$, and pure rubrene from separate sources, with the single evaporation rates being varied between about 0.1 to 10 A/s to obtain the desired mixing ratio of the mixed region 15.

Following formation of the organic hole transport region 13, the mixed region 15 and the electron transport region 16, the metal cathode 18 was deposited on the electron transport region 16 without breaking the vacuum.

The operational lifetime was tested with the organic light emitting devices operated at a temperature of 100° C. in nitrogen gas under AC driving conditions at an average constant current density of 31.25 mA/cm$^2$. At this current density, the initial luminance of the above organic light emitting device selected from the first group is about 1,710 cd/m$^2$.

For comparison purposes, a second group of similar organic light emitting devices comprising the same materials and structure as those of the first group, except that these devices did not have both (i) the buffer layer 14 in the hole transport region 13, and (ii) the thermal protective element 19 on the cathode 18, were formed and evaluated under the same conditions as in the first group. In these devices, a naphthyl-substituted benzidine derivative, N,N'-di-1-naphthyl-N,N'-diphenyl-1,1'-biphenyl-4,4'-diamine (NPB), and tris(8-hydroxyquinoline) aluminum (Alq$_3$), was used as the hole transport material and the electron transport material, respectively, comprising the hole transport 13 region, the mixed region 15, and the electron transport region in the organic light emitting device 16. The mixed region 15 was comprised of about 49.5 weight percent of NPB, about 49.5 weight percent of Alq$_3$ and further comprised about 1 weight percent of rubrene as an emitting dopant material. To enable a more accurate comparative evaluation between devices of the two groups, the thickness of the hole transport region 13 of devices in the second group was selected to be about 10 nanometers, which is similar to the thickness of the hole transport region 13 of devices of the first group exclusive of the thickness of the buffer layer 14 in the hole transport region 13 of the devices in the first group. The thickness of the mixed region 15 was about 80 nanometers. The thickness of the electron transport region 16 was about 20 nanometers. The thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers precoated on a glass substrate 11; and a cathode 18 comprised of a Mg:Ag (10:1 by weight) alloy having a thickness of about 120 nanometers. At an average constant current density of 31.25 mA/cm$^2$, the initial luminance of an organic light emitting device selected from the second group is about 1,680 cd/m$^2$, which is only 1.7 percent less than the initial luminance of a device from the first group (1,710 cd/m$^2$) at the same average constant current density of 31.25 mA/cm$^2$ indicating very similar electroluminescence efficiencies of devices from both groups.

From operational lifetime tests of a device from the first group, the half-life of device (time elapsed before the device luminance decreases to half the initial luminance), from an initial luminance of about 1,710 cd/m$^2$ was found to be about 500 hours for continuous device operation at a temperature of 100° C. As the device half-life is measured at an initial luminance of about 1,710 cd/m$^2$, which is about 17.1 times a typical display luminance of 100 cd/m$^2$ under normal conditions, the measured half-life of 500 hours represents an accelerated half-life under high stressing conditions at 100° C., which corresponds to a half-life of about 8,500 hours (17.1×500 hours) at 100° C. under a typical display luminance of 100 cd/m$^2$. The operational lifetime tests of a device from the second comparative group show a sudden decrease of device luminance to an undetectable level accompanied with a sudden decrease of the driving voltage of the device within the first 10 hours of operation at 100° C., indicating shorting of the device and the subsequent increase in leakage currents that do not produce luminescence.

This Example demonstrates the higher thermal stability of device embodiments according to this invention in comparison to the device indicated. The higher thermal stability, particularly the increased resistance to shorting, of device according to this invention is attributed primarily to the presence of the thermal protective element 19 in the device. As described in somewhat more detail in copending application U.S. Ser. No.09/770,154, the thermal protective element 19 prevents or at least reduces device susceptibility to shorting at high temperatures, such as, for example, at temperatures ranging from about 80° C. to about 100° C., or above. Therefore, the organic light emitting device according to this invention is more suitable for applications when a high thermal stability at elevated temperatures, such as, for example, at temperatures ranging from about 80° C. to about 100° C., and an increased resistance to shorting at these high temperatures are desired.

EXAMPLE III

Example to Demonstrate the Effect of the Buffer Layer 14, 24, 34 and 44 in the Hole Transport Region 13, 23 33 and 43 in Reducing the Rate of Increase of the Operating Voltage of the Organic Light Emitting Devices During Operation A first group of organic light emitting devices having a structure, such as device 10 in FIG. 1, were formed and evaluated. In these devices, a naphthyl-substituted benzidine derivative, N,N'-di-1-naphthyl-N,N'-diphenyl-1,1'-biphenyl-4,4'-diamine (NPB), and tris(8-hydroxyquinoline) aluminum (Alq$_3$), was used as the hole transport material and the electron transport material, respectively, comprising the hole transport 13 region, the mixed region 15, and the electron transport region in the organic light emitting device 16. The mixed region 15 comprised about 50 weight percent of NPB; and about 50 weight percent of Alq$_3$. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers. The thickness of the hole transport region 13 was about 75 nanometers, the thickness of the mixed region 15 was about 80 nanometers, the thickness of the electron transport region 16 was about 20 nanometers, and the thickness of the thermal protective element 19 was about 200 nanometers. The hole transport region 13, the mixed layer 15, and the electron transport region 16 were formed between an anode 12 comprised of indium-tin-oxide (ITO) having a thickness of about 200 nanometers, precoated on a glass substrate 11; and a cathode 18 comprised of a Mg:Ag (10:1 by weight) alloy having a thickness of about 120 nanometers.

The organic light emitting devices were fabricated using a vacuum evaporation process at a pressure of about 6×10$^{-6}$ Torr. The mixed region 15 was produced by co-evaporation of pure, about 100 to 99.5 percent, NPB and pure Alq$_3$ from separate sources, with the single evaporation rates being varied between about 0.1 to about 10 A/s to obtain the desired mixing ratio of the mixed region 15. Following formation of the organic hole transport region 13, the mixed region 15 and the electron transport region 16, the metal cathode 18 was deposited on the electron transport region 16 without breaking the vacuum.

The operational lifetime was tested with the organic light emitting devices operated at a temperature of 100° C. in nitrogen gas under AC driving conditions at an average constant current density of 31.25 mA/cm$^2$. At this current density, the initial luminance of a typical organic light emitting device selected from the first group is about 726 cd/m$^2$. The lower luminance of the device in this Example compared to the devices in the previous two Examples is attributed to the absence of dopant from the mixed region in the device of this Example.

For comparison purposes, a second group of similar organic light emitting devices comprising the same materials and structure as those of the above first group, except that these devices did not have the buffer layer 14 in the hole transport region 13 were also formed and evaluated under same conditions as in the first group. In these devices, a naphthyl-substituted benzidine derivative, N,N'-di-1-naphthyl-N,N'-diphenyl-1,1'-biphenyl-4,4'-diamine (NPB), and tris(8-hydroxyquinoline) aluminum (Alq$_3$), was used as the hole transport material and the electron transport material, respectively, comprising the hole transport 13 region, the mixed region 15, and the electron transport region in the organic light emitting device 16. The mixed region 15 was comprised of about 50 weight percent of NPB; and about 50 weight percent of Alq$_3$. Silicon monoxide (SiO) was used to form the thermal protective element 19. To enable a more accurate comparative evaluation between devices of the two groups, the thickness of the hole transport region 13 of devices in the second group was selected to be about 60 nanometers, which is similar to the thickness of the hole transport region of devices of the first group 13 exclusive of the thickness of the buffer layer 14 in the hole transport region of the devices in the first group. The thickness of the mixed region 15 was about 80 nanometers. The thickness of the electron transport region 16 was about 20 nanometers. The thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers, precoated on a glass substrate 11, and a cathode 18 comprised of a Mg:Ag (10:1 by weight) alloy having a thickness of about 120 nanometers. At an average constant current density of 31.25 mA/cm$^2$, the initial luminance of organic light emitting devices from the second group is about 842 cd/m$^2$.

From operational lifetime tests of a device from each of the two groups, the driving voltage required to drive an average constant current of about 31.25 mA/cm$^2$ through the devices was found to increase by only about 4 percent for a device from the first group after about 50 hours of continuous device operation at 100° C., whereas the increase in driving voltage of a device from the second group was much less desirable, amounting to about 21 percent of the initial value after about 50 hours of continuous device operation at 100° C. This Example demonstrates the effect of the buffer 14, 24, 34 and 44 in the hole transport region 13, 23, 33 and 43 in reducing the rate of increase of the operating voltage of the organic light emitting device during operation at high temperatures, such as, for example, at temperatures ranging from about 80° C. to about 100° C., or above. A more rapid increase in the driving voltage of the organic light emitting devices can be undesirable since it requires additional complexities in the display drivers and also promotes device failure by means of electric field breakdown.

EXAMPLE IV

Example to Demonstrate the Effect of the Thickness of the Hole Transport Region for a Particular Thickness of the Buffer Layer in the Hole Transport Region on Device Efficiency and on the Stability of the Operating Voltage of the Device A first group of organic light emitting devices having a structure, such as the device 10 in FIG. 1, were formed and evaluated. In these devices a naphthyl-substituted benzidine derivative, N,N'-di-1-naphthyl-N,N'-di-1-naphthyl-N,N'-diphenyl-1,1'-biphenyl-4,4'-diamine (NPB), and tris(8-hydroxyquinoline) aluminum (Alq$_3$), were used as the hole transport material and the electron transport material, respectively, comprising the hole transport region 13, the mixed region 15 and the electron transport region 16 in the organic light emitting device. The mixed region 15 comprised about 49.5 weight percent of NPB; about 49.5 weight percent of Alq$_3$; and further comprised about 1 weight percent of rubrene as an emitting dopant material. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers. The thickness of the hole 13 transport region was about 25 nanometers, the thickness of the mixed region 15 was about 80 nanometers, the thickness of the electron transport region 16 was about 20 nanometers, and the thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers, precoated on a glass substrate 11; and a cathode 18 comprised of a Mg:Ag (10:1 by weight) alloy having a thickness of about 120 nanometers.

The organic light emitting devices were fabricated using a vacuum evaporation process at a pressure of about 6×10$^{-6}$ Torr. The mixed region 15 was produced by co-evaporation of pure NPB, pure Alq$_3$, and pure rubrene from separate sources, with the single evaporation rates being varied between about 0.1 to about 10 A/s to obtain the desired mixing ratio of the mixed region 15. Following formation of the organic hole transport region 13, the mixed region 15 and the electron transport region 16, the metal cathode 18 was deposited on the electron transport region 16 without breaking the vacuum.

The operational lifetime of an organic light emitting device from the first group was tested with the organic light emitting device operated at a temperature of 100° C. in nitrogen gas under AC driving conditions at an average constant current density of 31.25 mA/cm$^2$.

For comparison purposes, a second group of similar organic light emitting devices comprising the same materials and structure as those of the first group, except that in these devices the thickness of the hole transport 13 was increased to 75 nanometers while the thickness of the buffer layer 14 in the hole transport region 13 was retained the same as in devices in the first group, was formed and evaluated under same conditions as in devices of the first group.

Furthermore, a third group of similar organic light emitting devices comprising the same materials and structures as those of the first and the second groups, except that in these devices the thickness of the hole transport region 13 was reduced to 15 nanometers resulting in devices wherein the hole transport region 13 comprises the buffer layer 14, was also formed and evaluated under same conditions as in devices of the first and second groups.

The following Table shows a comparison of the electroluminescence efficiency and the increase in driving voltage of an organic light emitting device selected from each of the three groups:

|  | First Group | Second Group | Third Group |
| --- | --- | --- | --- |
| Thickness of buffer layer (nm) | 15 | 15 | 15 |
| Thickness of hole transport region (nm) | 25 | 75 | 15 |
| Electroluminescence efficiency (cd/A) | 5.5 | 6.6 | 4.0 |
| Percentage increase in driving voltage device operation at 100° C. | 3.5 | 8.5 | 2.1 |

The results indicate that a smaller thickness of the hole transport region 13, for the same thickness of the buffer layer 14 in the hole transport region 13 leads to a desirable slower increase in the driving voltage of the device, however, in the same time, leads to an undesirable decrease in the electroluminescence efficiency of the device. There is, therefore, a preferred range of thickness for the hole transport region 13 for a certain thickness of the buffer layer 14 where an optimum device performance is achieved, particularly as related to achieving a satisfactory driving voltage stability with minimal adverse effect on the electroluminescence efficiency.

EXAMPLE V

Example to Demonstrate the Effect of Introducing an Electron Injection Layer 27 and 47 in Between the Cathode 28 and 48 and the Electron Transport Region 26 and 46 on Increasing Device Efficiency A first group of organic light emitting devices having a structure, such as the device 10 in FIG. 1, was formed and evaluated. In these devices a naphthyl-substituted benzidine derivative, N,N'-di-1-naphthyl-N,N'-di-1-naphthyl-N,N'-diphenyl-1,1'-biphenyl-4,4'-diamine (NPB), and tris(8-hydroxyquinoline) aluminum ($Alq_3$), was used as the hole transport material and the electron transport material, respectively, comprising the hole transport region 13, the mixed region 15 and the electron transport region 16 in the organic light emitting device. The mixed region 15 comprised about 49.5 weight percent of NPB, about 49.5 weight percent of $Alq_3$, and further comprised about 1 weight percent of rubrene as an emitting dopant material. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers, the thickness of the hole transport region 13 was about 25 nanometers, the thickness of the mixed region 15 was about 80 nanometers, the thickness of the electron transport region 16 was about 20 nanometers, and the thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers, precoated on a glass substrate 11, and a cathode 18 comprised of a Mg:Ag (10:1 by weight) alloy having a thickness of about 120 nanometers.

The organic light emitting devices were fabricated using a vacuum evaporation process at a pressure of about $6 \times 10^{-6}$ Torr. The mixed region 15 was produced by co-evaporation of pure NPB, pure $Alq_3$, and pure rubrene from separate sources, with the single evaporation rates being varied between about 0.1 to about 10 A/s to obtain the desired mixing ratio of the mixed region 15. Following formation of the organic hole transport region 13, the mixed region 15 and the electron transport region 16, the metal cathode 18 was deposited on the electron transport region 16 without breaking the vacuum.

A second group of organic light emitting devices having a structure, such as the device 20 in FIG. 2, were formed and evaluated. These devices were similar to organic light emitting devices of the first group in all respects except that the devices of the second group further included an electron injection layer 27 interposed between the electron transport region 26 and the cathode 28, wherein this electron injection layer 27 was comprised of LiF and had a thickness of about 0.8 nanometer. In these devices a naphthyl-substituted benzidine derivative, N,N'-di-1-naphthyl-N,N'-di-1-naphthyl-N,N'-diphenyl-1,1'-biphenyl-4,4'-diamine (NPB), and tris(8-hydroxyquinoline) aluminum ($Alq_3$), was used as the hole transport material and the electron transport material, respectively, comprising the hole transport region 23, the mixed region 25 and the electron transport region 26 in the organic light emitting device. The mixed region 25 comprised of about 49.5 weight percent of NPB, about 49.5 weight percent of $Alq_3$, and further comprised of about 1 weight percent of rubrene as an emitting dopant material. Copper phthalocyanine (CuPc) was used to form the buffer layer 24 in the hole transport region 23. Silicon monoxide (SiO) was used to form the thermal protective element 29. The thickness of the buffer layer 24 was about 15 nanometers, the thickness of the hole transport region 23 was about 25 nanometers, the thickness of the mixed region 25 was about 80 nanometers, the thickness of the electron transport region 26 was about 20 nanometers, the thickness of the thermal protective element 29 was about 200 nanometers, and the hole transport region 23; the mixed layer 25, the electron transport region 26 and the electron injection layer 27 were formed between an anode 22 comprised of indium-tin-oxide (ITO) having a thickness of about 200 nanometers, precoated on a glass substrate 21; and a cathode 28 comprised of a Mg:Ag (10:1 by weight) alloy having a thickness of about 120 nanometers.

The organic light emitting devices were fabricated using a vacuum evaporation process at a pressure of about $6 \times 10^{-6}$ Torr. The mixed region 25 was produced by co-evaporation of pure NPB, pure $Alq_3$, and pure rubrene from separate sources, with the single evaporation rates being varied between about 0.1 to about 10 A/s to obtain the desired mixing ratio of the mixed region 25.

Following formation of the organic hole transport region 23, the mixed region 25, the electron transport region 26, and the electron injection layer 27, the metal cathode 18 was deposited on the electron transport region 26 without breaking the vacuum.

A comparison of the electroluminescence efficiency and the driving voltage at a current density of about 31.25 $mAcm^2$ between a device selected from the first group and a device selected from the second group revealed an electroluminescence efficiency of about 5.5 cd/A and about 7.4 cd/A; and a driving voltage of 7.85 volts and 7.03 volts for device from the first and second groups, respectively. These results indicated about a 35 percent higher electroluminescence efficiency and about a 38 percent higher energy conversion efficiency of the device from the second group.

This Example illustrates that the introduction of an electron injection layer 27 in between the electron transport region 26 and the cathode 28 can result in a significant increase in both the electroluminescence efficiency and the energy conversion efficiency of these organic light emitting devices.

EXAMPLE VI

Example to Demonstrate the Effect of Using an Electron Transport Region 16, 26, 36, and 46 Comprised of a Plurality of Layers on Increasing Device Efficiency A first group of organic light emitting devices having a structure, such as the device 10 in FIG. 1, were formed and evaluated. In these devices, a naphthyl-substituted benzidine derivative, N,N'-di-1-naphthyl-N,N'-di-1-naphthyl-N,N'-diphenyl-1,1'-biphenyl-4,4'-diamine (NPB), and tris(8-hydroxyquinoline) aluminum ($Alq_3$), was used as the hole transport material and the electron transport material, respectively, comprising the hole transport region 13, the mixed region 15 and the electron transport region 16 in the organic light emitting device. The mixed region 15 comprised about 49.5 weight percent of NPB, about 49.5 weight percent of $Alq_3$, and further comprised about 1 weight percent of rubrene as an emitting dopant material. Copper phthalocyanine (CuPc) was used to form the buffer layer 14 in the hole transport region 13. Silicon monoxide (SiO) was used to form the thermal protective element 19. The thickness of the buffer layer 14 was about 15 nanometers, the thickness of the hole transport region 13 was about 25 nanometers, the thickness of the mixed region 15 was about 80 nanometers, the thickness of the electron transport region 16 was about 20 nanometers, and the thickness of the thermal protective element 19 was about 200 nanometers. The hole transport region 13, the mixed layer 15 and the electron transport region 16 were formed between an anode 12 comprised of indium-tin-oxide (ITO) having a thickness of about 200 nanometers, precoated on a glass substrate 11; and a cathode 18 comprised of a Mg:Ag (10:1 by weight) alloy having a thickness of about 120 nanometers.

The organic light emitting devices were fabricated using a vacuum evaporation process at a pressure of about $6 \times 10^{-6}$ Torr. The mixed region 15 was produced by co-evaporation of pure NPB, pure $Alq_3$, and pure rubrene from separate sources, with the single evaporation rates being varied between about 0.1 to about 10 A/s to obtain the desired mixing ratio of the mixed region 15.

Following formation of the organic hole transport region 13, the mixed region 15 and the electron transport region 16, the metal cathode 18 was deposited on the electron transport region 16 without breaking the vacuum.

For comparison purposes, a second group of organic light emitting devices comprising the same materials and structure as devices in the first group, except that in these comparison devices the electron transport region further included a layer of about 10 nanometers thick comprised of a triphenyl triazine compound, in contact with the cathode 18.

A comparison of the electroluminescence efficiency and the driving voltage at a current density of about 31.25 $mAcm^2$ reveals an electroluminescence efficiency of about 5.5 cd/A and about 7.3 cd/A for a device selected from the first group and a device selected from the second group, respectively, while the driving voltage at this current density for the two devices is almost equal, at about 8.4 volts. These results indicate about a 33 percent higher electroluminescence efficiency and about a 33 percent higher energy conversion efficiency of the device from the second group.

This Example illustrates that the use of an electron transport region formed of a plurality of layers can result in a significant increase in both the electroluminescence efficiency and the energy conversion efficiency of the organic light emitting device according to this invention, and can be used when higher efficiencies are desired.

Other modifications of the present invention will or may occur to those of ordinary skill in the art subsequent to a review of the present application. These modifications and equivalents thereof are intended to be included within the scope of the present invention.

What is claimed is:

1. An organic light emitting device comprising in an optional sequence
    (i) a substrate;
    (ii) a first electrode;
    (iii) a mixed region comprising a mixture of a hole transport material and an electron transport material, and wherein this mixed region includes at least one organic luminescent material;
    (iv) a second electrode;
    (v) a thermal protective element coated on the second electrode, wherein one of the two said first and second electrodes is a hole injection anode, and one of the two said electrodes is an electron injection cathode, and wherein the organic light emitting device further comprises;
    (vi) a hole transport region, interposed between the anode and the mixed region, wherein the hole transport region optionally includes a buffer layer; and
    (vii) an electron transport region interposed between the second electrode and the mixed region.

2. An organic light emitting device in accordance with claim 1 wherein the mixed region comprises from about 5 weight percent to about 95 weight percent of the hole transport material (iii); and from about 95 weight percent to about 5 weight percent of said electron transport material (iii), and at least one of the hole transport material and the electron transport material is an organic luminescent component.

3. An organic light emitting device in accordance with claim 1 wherein the mixed region comprises from about 25 weight percent to about 75 weight percent of said hole transport material, and from about 75 weight percent to about 25 weight percent of said electron transport material, and wherein the total thereof is about 100 percent, and optionally wherein at least one of the hole transport material and the electron transport material is an organic luminescent material.

4. An organic light emitting device in accordance with claim 1 wherein the mixed region (iii) comprises from about 5 weight percent to about 95 weight percent of said hole transport material, from about 95 weight percent to about 5 weight percent of said electron transport material, and from about 0.01 weight percent to about 25 weight percent of at least one organic luminescent dopant material, or wherein the mixed region (iii) comprises from about 25 weight percent to about 75 weight percent of said hole transport material, from about 75 weight percent to about 25 weight percent of said electron transport material, and from about 0.1 weight percent to about 5 weight percent of at least one organic luminescent dopant material.

5. An organic light emitting device in accordance with claim 1 wherein the mixed region comprises from about 25 weight percent to about 75 weight percent of said hole transport material, from about 75 weight percent to about 25 weight percent of said electron transport material, and from about 5 weight percent to about 25 weight percent of at least one organic luminescent dopant material.

6. An organic light emitting device in accordance with claim 1 wherein one surface of the buffer layer in the hole transport region (vi) is contacting the anode.

7. An organic light emitting device in accordance with claim 1 wherein the hole transport material comprising the mixed region (iii) and the hole transport material comprising the hole transport region (vi) are comprised of similar or dissimilar components; and wherein the electron transport material comprising the mixed region (iii) and the electron transport material comprising the electron transport region (vii) are comprised of similar or dissimilar components.

8. An organic light emitting device in accordance with claim 1 wherein the electron transport region is comprised of two or more layers; and optionally wherein the materials comprising the individual layers thereof are comprised of dissimilar components.

9. An organic light emitting device in accordance with claim 1 further comprising an electron injection layer interposed between the electron transport region and the second electrode.

10. An organic light emitting device in accordance with claim 1 wherein the thickness of the mixed region (iii) is from about 1 nanometers to about 1,000 nanometers; the thickness of the electron transport region (vii) is from about 5 nanometers to about 500 nanometers; the thickness of the thermal protective element is from about 1 nanometer to about 100 microns; the thickness of the hole transport region (vi) is from about 5 nanometers to about 500 nanometers; the thickness of the buffer layer in the hole transport region is from about 1 nanometer to about 100 nanometers; and optionally wherein the thickness of the buffer layer is at least about 1 nanometer less than the thickness of the hole transport region.

11. An organic light emitting device in accordance with claim 1 wherein the thickness of the mixed region (iii) is from about 10 nanometers to about 200 nanometers; the thickness of the electron transport region (vii) is from about 10 nanometers to about 80 nanometers; the thickness of the thermal protective element is from about 10 nanometers to about 1000 nanometers; the thickness of the hole transport region is from about 20 nanometers to about 80 nanometers; the thickness of the buffer layer in the hole transport region is from about 5 nanometers to about 50 nanometers; and wherein the thickness of the buffer layer is at least 1 nanometer less than the thickness of the hole transport region.

12. An organic light emitting device in accordance with claim 1 wherein the thickness of the hole transport region (vi) is from about 5 nanometers to about 20 nanometers greater than the thickness of the buffer layer in the hole transport region.

13. An organic light emitting device in accordance with claim 1 wherein the thickness of the hole transport region is from about 20 nanometers to about 75 nanometers greater than the thickness of the buffer layer in the hole transport region, and wherein the thickness of the electron transport region is from about 5 nanometers to about 500 nanometers, wherein the thickness of each of the individual layers is at least about 1 nanometer, and further including an electron injector layer wherein the thickness of the electron injection layer is from about 1 nanometer to about 100 nanometers.

14. An organic light emitting device in accordance with claim 1 wherein at least one hole transport material comprising at least one of said hole transport region and the mixed region (iii) is selected from the group consisting of aromatic tertiary amine compounds and indolocarbazole compounds; and at least one electron transport material comprising at least one of said electron transport region (vii) and the mixed region (iii) is selected from the group consisting of metal oxinoid compounds, stilbene derivatives, oxadiazole metal chelate compounds and triazine compounds.

15. An organic light emitting device in accordance with claim 14 wherein the hole transport material is selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and the electron transport material is selected from the group consisting of tris(8-hydroxyquinoline) aluminum and bis(8-hydroxyquinolato)-(4-phenylphenolato)aluminum.

16. An organic light emitting device in accordance with claim 1 wherein the buffer layer is comprised of a porphyrin compound or a metal oxide.

17. An organic light emitting device in accordance with claim 16 wherein the porphyrin compound is copper phthalocyanine.

18. An organic light emitting device in accordance with claim 1 wherein the thermal protective element is comprised of a porphyrin compound, a metal oxide, a metal of Ti, Cr, Ni or the alloys thereof.

19. An organic light emitting device in accordance with claim 1 wherein the thermal protective element is selected from the group consisting of SiO, $SiO_2$, $ZrO_2$ and mixtures thereof.

20. An organic light emitting device in accordance with claim 9 wherein the electron injection layer is comprised of a porphyrin compound, a metal oxide or an alkaline metal halide.

21. An organic light emitting device in accordance with claim 20 wherein the alkaline metal halide is LiF.

22. An organic light emitting device in accordance with claim 4 wherein at least one emitting dopant material is a fluorescent material or a phosphorescent material.

23. An organic light emitting device in accordance with claim 22 wherein said at least one emitting dopant material is a fluorescent material selected from the group consisting of coumarin, dicyanomethylene pyranes, polymethine, oxabenzanthrane, xanthene, pyrylium, carbostyl, perylene, quinacridone, rubrene, anthracene, coronene, phenanthrecene, pyrene, butadiene, stilbene, lanthanide metal chelate complexes, rare-earth metal chelate complexes, 4-(dicyanomethylene)-2-1-propyl-6-(1,1,7,7-tetramethyljulolidyl-9-enyl)-4H-pyran, and derivatives thereof.

24. An organic light emitting device in accordance with claim 22 wherein the emitting dopant material is selected from the group consisting of rubrene and N,N'-dimethylquinacridone, or wherein the emitting dopant material is a phosphorescent material selected from the group consisting of 2,3,7,8,12,13,17,18-octaethyl-21 H23H-phorpine platinum(II) and fac tris(2-phenylpyridine)iridium.

25. An organic light emitting device in accordance with claim 1 wherein the second electrode is a cathode coated with a thermal protective element, and the first electrode is an anode contacting a supportive substrate, or wherein the anode is coated with a thermal protective element; and the cathode is in contact with a supporting substrate.

26. An organic light emitting device comprising
(i) a substrate;
(ii) a first electrode in contact with the substrate;
(iii) a hole transport region in contact with the electrode, comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and which region further comprises a buffer layer contacting the first electrode, and optionally wherein the thickness of the buffer layer is from about 10 nanometers to about 30 nanometers, and the thickness of the hole transport region is from about 5 nanometers to about 20 nanometers greater than the thickness of the buffer layer;
(iv) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; from about 75 weight percent to about 25 weight percent of an electron transport material selected from the group consisting of tris(8-hydroxyquinoline) aluminum and bis(8-hydroxyquinolato)-(4-phenylphenolato)aluminum; and which region further comprises from about 0.1 weight percent to about 5 weight percent of a dopant material selected from the group consisting of N,N'-dimethylquinacridone, rubrene or 4-(dicyanomethylene)-2-1-propyl-6-(1,1,7,7-tetramethyljulolidyl-9-enyl)-4H-pyran, and optionally wherein thickness of the mixed region is from about 50 nanometers to about 150 nanometers;
(v) an electron transport region situated on the mixed region comprised of an electron transport material selected from the group consisting of tris(8-hydroxyquinoline) aluminum and bis(8-hydroxyquinolato)-(4-phenylphenolato)aluminum, and optionally wherein the thickness of the electron transport region is from about 10 nanometers to about 50 nanometers;
(vi) a second electrode situated on the electron transport region optionally comprised of a Mg:Ag or a Li:Al alloy of a thickness from about 50 nanometers to about 500 nanometers; and
(vii) a thermal protective element situated on the second electrode comprised of metal oxides SiO, SiO$_2$ or mixtures thereof of a thickness of from about 100 nanometers to about 1,000 nanometers.

27. An organic light emitting device in accordance with claim 1 and comprised of
(i) a substrate;
(ii) an anode situated on the substrate comprised of indium-tin-oxide with a thickness of from about 30 to about 300 nanometers;
(iii) a hole transport region situated on the anode comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and further comprising a buffer layer contacting the anode and situated between said hole transport region and said anode, and wherein the thickness of the buffer layer is from about 10 nanometers to about 30 nanometers; and the thickness of the hole transport region is from about 5 nanometers to about 20 nanometers greater than the thickness of the buffer layer;
(iv) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole, and from about 75 weight percent to about 25 weight percent of an electron transport material selected from the group consisting of tris(8-hydroxyquinoline) aluminum and bis(8-hydroxyquinolato)-(4-phenylphenolato) aluminum; and further including from about 0.1 weight percent to about 5 weight percent of a dopant material selected from the group consisting of N,N'-dimethylquinacridone, rubrene or 4-(dicyanomethylene)-2-1-propyl-6-(1,1,7,7-tetramethyljulolidyl-9-enyl)-4H-pyran, and wherein the thickness of the mixed region is from about 50 nanometers to about 150 nanometers;
(v) an electron transport region situated on the mixed region comprised of an electron transport material selected from the group consisting of tris(8-hydroxyquinoline) aluminum and bis(8-hydroxyquinolato)-(4-phenylphenolato) aluminum, and wherein the thickness of the electron transport region is from about 10 nanometers to about 50 nanometers;
(vi) an electron injection layer situated on the electron transport region comprised of a thickness of from about 1 nanometer to about 3 nanometers;
(vii) a suitable second electrode situated on the electron injection layer comprised of a Al, Mg:Ag alloy or a Li:Al alloy, each of a thickness from about 50 nanometers to about 500 nanometers; and
(viii) a thermal protective element on the second electrode comprised of SiO or SiO$_2$ of a thickness of from about 100 nanometers to about 1,000 nanometers.

28. An organic light emitting device in accordance with claim 1 wherein
(i) the first electrode, which is situated on said substrate, is comprised of an anode of indium-tin-oxide with a thickness of from about 30 to about 300 nanometers;
(ii) the hole transport region situated on said first electrode is comprised of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole; and further comprising a buffer layer comprised of copper phthalocyanine and wherein the thickness of the buffer layer is from about 10 nanometers to about 30 nanometers, and the thickness of the hole transport region is from about 5 nanometers to about 20 nanometers greater than the thickness of the buffer layer;
(iii) a mixed region situated on the hole transport region comprised of from about 25 weight percent to about 75 weight percent of a hole transport material selected from the group consisting of N,N'-di-1-naphthyl-N,N'-diphenyl-1,1'-biphenyl-4,4'-diamine, 5,11-di-naphthyl-5,11-dihydroindolo[3,2-b]carbazole, and 2,8-dimethyl-5,11-di-naphthyl-5,11-dihydroindolo[3,2-b]carbazole;

from about 75 weight percent to about 25 weight percent of an electron transport material selected from the group consisting of tris(8-hydroxyquinoline) aluminum and bis(8-hydroxyquinolato)-(4-phenylphenolato) aluminum; and from about 0.1 weight percent to about 5 weight percent of a dopant material selected from the group consisting of N,N'-dimethylquinacridone, rubrene or 4-(dicyanomethylene)-2-1-propyl-6-(1,1,7,7-tetramethyljulolidyl-9-enyl)-4H-pyran and wherein the thickness of the mixed region is from about 50 nanometers to about 150 nanometers;

(iv) an electron transport region on the mixed region comprised of two layers and wherein the first layer contacting the mixed region is comprised of an electron transport material selected from the group consisting of tris(8-hydroxyquinoline) aluminum and bis(8-hydroxyquinolato)-(4-phenylphenolato)aluminum; and the second layer contacting the first layer is comprised of a triazine compound and wherein the thickness of the first layer of the electron transport region is from about 10 nanometers to about 30 nanometers; and the thickness of the second layer of the electron transport region is from about 5 nanometers to about 25 nanometers;

(v) a cathode situated on the electron transport region of a thickness of from about 50 nanometers to about 500 nanometers; and (vi) a thermal protective element on the cathode comprised of SiO, $SiO_2$ or mixtures thereof of a thickness of from about 100 nanometers to about 1,000 nanometers.

29. A display comprising at least one organic light emitting device according to claim 1.

30. An organic light emitting device in accordance with claim 1 wherein said protective element is SiO.

31. An organic light emitting device in accordance with claim 1 wherein said protective element is $SiO_2$.

32. An organic light emitting device in accordance with claim 1 wherein said thermal protective element is a single layer or a multiplicity of layers.

33. An organic light emitting device in accordance with claim 1 wherein said thermal protective element is a metal oxide.

34. An organic light emitting device in accordance with claim 33 wherein said metal oxide is aluminum oxide or zirconium oxide.

35. An organic light emitting device in accordance with claim 1 wherein said first and said second electrode location is reversed.

36. An organic light emitting device in accordance with claim 1 wherein said first electrode is an anode and said second electrode is a cathode.

* * * * *